(12) United States Patent
Scheuerlein

(10) Patent No.: US 8,659,932 B2
(45) Date of Patent: Feb. 25, 2014

(54) SINGLE DEVICE DRIVER CIRCUIT TO CONTROL THREE-DIMENSIONAL MEMORY ELEMENT ARRAY

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/608,098

(22) Filed: Sep. 10, 2012

(65) Prior Publication Data

US 2013/0003440 A1    Jan. 3, 2013

Related U.S. Application Data

(62) Division of application No. 12/938,028, filed on Nov. 2, 2010, now Pat. No. 8,284,589.

(60) Provisional application No. 61/375,514, filed on Aug. 20, 2010.

(51) Int. Cl.
*G11C 11/00* (2006.01)
*G11C 11/36* (2006.01)

(52) U.S. Cl.
USPC .......................................... 365/148; 365/175

(58) Field of Classification Search
USPC ................................................. 365/148, 175
See application file for complete search history.

(56) References Cited

U.S. PATENT DOCUMENTS

| | | | |
|---|---|---|---|
| 4,646,266 A | 2/1987 | Ovshinsky et al. | |
| 5,014,241 A | 5/1991 | Asakura et al. | |
| 5,751,012 A | 5/1998 | Wolstenholme et al. | |
| 5,835,396 A | 11/1998 | Zhang | |
| 5,841,687 A | 11/1998 | Rees | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,420,215 B1 | 7/2002 | Knall et al. | |
| 6,618,295 B2 | 9/2003 | Scheuerlein | |
| 6,631,085 B2 | 10/2003 | Kleveland et al. | |
| 7,081,377 B2 | 7/2006 | Cleeves | |
| 7,859,884 B2 | 12/2010 | Scheuerlein | |
| 8,040,723 B2 | 10/2011 | Sheu et al. | |
| 8,102,698 B2 | 1/2012 | Scheuerlein | |
| 2002/0163033 A1 | 11/2002 | Sugawara et al. | |
| 2005/0269553 A1 | 12/2005 | Sen et al. | |

(Continued)

OTHER PUBLICATIONS

International Preliminary Report on Patentability issued in PCT Application No. PCT/US2011/047788, mailed on Mar. 7, 2013.

(Continued)

*Primary Examiner* — Trong Phan
(74) *Attorney, Agent, or Firm* — The Marbury Law Group PLLC

(57) ABSTRACT

A memory device includes diode plus resistivity switching element memory cells coupled between bit and word lines, single device bit line drivers with gates coupled to a bit line decoder control lead, sources/drains coupled to a bit line driver, and drains/sources coupled to bit lines, single device word line drivers with gates coupled to a word line decoder control lead, sources/drains coupled to a word line driver output, and drains/sources coupled to word lines, a first bleeder diode coupled between a bit line and a first bleeder diode controller, and a second bleeder diode coupled between a word line and a second bleeder diode controller. The first bleeder diode controller connects the first bleeder diode to low voltage in response to a bit line decoder signal. The second bleeder diode controller connects the second bleeder diode to high voltage in response to a word line decoder signal.

10 Claims, 25 Drawing Sheets

(56) References Cited

U.S. PATENT DOCUMENTS

2006/0291277 A1 12/2006 Cho et al.
2007/0114509 A1 5/2007 Herner
2008/0025085 A1 1/2008 Scheuerlein et al.
2009/0027954 A1 1/2009 Kang et al.
2010/0128516 A1 5/2010 Cho et al.
2010/0128517 A1 5/2010 Bedeschi et al.
2010/0173457 A1 7/2010 Herner et al.
2010/0271885 A1 10/2010 Scheuerlein et al.

OTHER PUBLICATIONS

International Search Report & Written Opinion, WIPO, PCT/US2010/031876, Jul. 22, 2010.

Naji, et al., "A 256 kb 3.0V 1T1MTJ Nonvolatile Magnetoresistive RAM," Digest of Technical Papers of the 2001 IEEE International Solid State Circuits Conference, ISSCC 2001 Session 7 Technology Directions: Advanced Technologies 7.6, Feb. 6, 2001, pp. 94-95, 404-405 of ISSCC Visual Supplement.

International Search Report & Written Opinion, WIPO, PCT/US2011/047788, Mar. 2, 2012.

SINGLE DEVICE DRIVER CIRCUIT TO CONTROL THREE-DIMENSIONAL MEMORY ELEMENT ARRAY

RELATED APPLICATIONS

This application is a divisional of U.S. application Ser. No. 12/938,028, filed Nov. 2, 2010, which claims the benefit of priority to U.S. Provisional Patent Application No. 61/375,514, entitled "Single Device Driver Circuit To Control Three-Dimensional Memory Element Array" filed Aug. 20, 2010, the entire contents of which are hereby incorporated by reference.

FIELD

The present invention relates to semiconductor integrated circuits containing memory arrays, particularly biasing circuits for memory arrays with extremely small pitch dimensions, and more particularly such memories in a three-dimensional memory array.

BACKGROUND

Semiconductor integrated circuits have progressively reduced their feature line widths into the deep sub-micron region. Recent developments in certain memory cell technologies have resulted in word lines and bit lines having an extremely small pitch. For example, certain passive element memory cell arrays may be fabricated having word lines approaching the minimum feature size and minimum feature spacing for the particular word line interconnect layer. Such passive element memory cell arrays also have bit lines approaching the minimum feature with and minimum feature spacing for the particular bit line interconnect layer. Additionally, three-dimensional memory arrays having more than one plane of memory cells have been fabricated containing so-called $4F^2$ memory cells on each memory plane.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
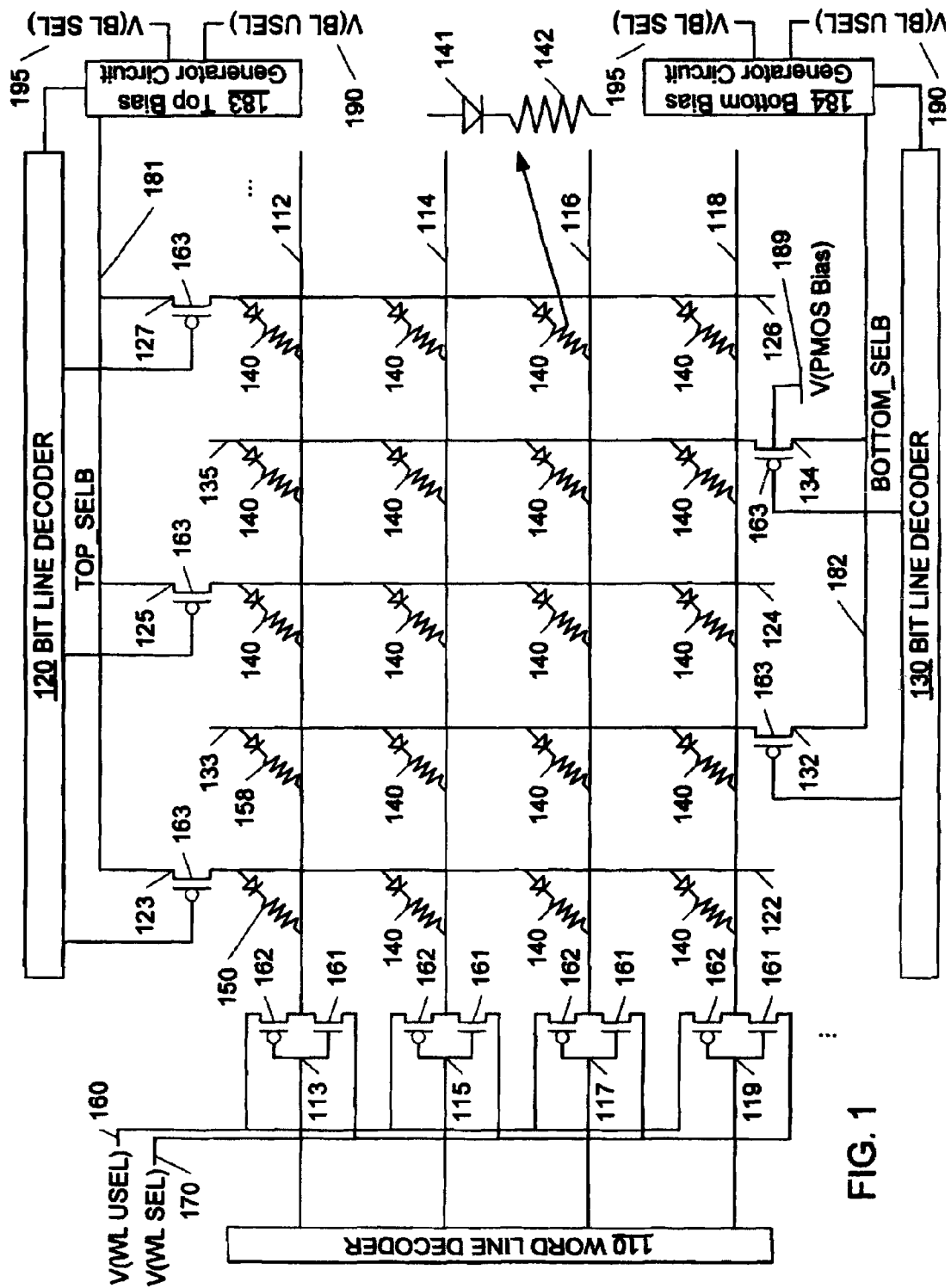
FIG. 1 is a diagram of a memory cell array with a single device bit line driver and a dual device word line driver suitable for use with the various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. The drawings are not to scale, and well-known structures and devices are shown in simplified form to facilitate description of the various embodiments.

The word "exemplary" is used herein to mean "serving as an example, instance, or illustration." Any implementation described herein as "exemplary" is not necessarily to be construed as preferred or advantageous over other implementations. The terms "word line," and "X-line," and "bit line" and "Y-line" are used interchangeably herein to refer to electrical connections within and among a memory cell array. For example, word lines may refer to rows or X lines, while bit lines refer to column or Y lines within a planar memory cell array. The term "zia" is used herein to refer to electrical connections between planar arrays in different levels of a 3D memory device, and thus which extended in the Z direction with respect to planar memory cell arrays within a 3-D memory array device.

Integrated circuits incorporating a memory array often subdivided array into a number of smaller arrays, which are all sometimes also known as sub-arrays. As used herein, an "array" refers to a contiguous group of memory cells having continuous word and bit lines generally unbroken by decoders, drivers, sense amplifiers and input/output circuits. An integrated circuit including a memory array may have one array, more than one array, or even a large number of arrays. As used herein, a three-dimensional (3D) circuit memory array refers generally to a monolithic integrated circuit structure, rather than more than one integrated circuit device package together (e.g., die-bonded together) or in close proximity.

The various embodiments are described with reference to the drawings which show circuit elements implemented in arrays of PMOS and NMOS transistors. As will be appreciated by one of skill in the art, circuits implementing NMOS transistors may be replaced with circuits implementing PMOS transistors, and vice a versa, such as by inverting connections, select and unselect voltages, etc.

The various embodiments provide a single device array line driver and decoder controlled bleeder diode array that reduces the physical size and complexity of circuits used to control word and bit lines and reduce leakage currents in a nonvolatile memory array of the resistivity switching storage element of the memory cells. This is accomplished by providing a synchronized control over the unselected bias voltage path and the selected bias voltage path through a memory circuit, by controlling connections of bleeder diodes using the same control signal as is used to control the bit or word line selection device.

The development of solid-state memory technology has resulted in significant improvements in the density of memory cells. Recent improvements in interfacing circuits have reduced the complexity of array line drivers, examples of which are described in U.S. patent application Ser. No. 12/385,964, entitled "Reduced Complexity Array Line Drivers For 3D Matrix Arrays" filed Apr. 24, 2009 ("the '964 application"), the entire contents of which is hereby incorporated by reference, and included as attachment one hereto.

FIG. 1 illustrates a portion of an exemplary memory cell array 100 described in the '964 application featuring a single device bit line driver controlled by a decoder 120 and a dual device word line driver controlled by a decoder 110 coupled to an array of bit lines, word lines and memory cells suitable for use with the various embodiments. Such an exemplary memory cell array 100 may include a word line (i.e., row) decoder 110, a top bit line (i.e., column) decoder 120, a bottom bit line decoder 130, word lines 112, 114, 116, 118, top bit lines (i.e., bit lines connected to the top bit line decoder 120) 122, 124, 126, bottom bit lines (i.e., bit lines connected to the bottom bit line decoder 130) 133, 135, and memory cells 140, 150 coupled between the bit lines and word lines. While FIG. 1 shows top and bottom bit line decoders, the memory array may also be configured with a single (e.g., top) bit line decoder 120. Each of the memory cells 140 is connected between one bit line and one word line. Each of the memory cells 140 includes a current steering element or diode 141 coupled in series to a resistivity switching storage element 142. The diode 141 may be any of a number of known types of diodes, such as a p-n semiconductor diode, a p-i-n semiconductor diode, a metal insulator metal (MIM) diode, or a metal insulator-insulator metal (MUM) diode. The resistivity switching storage element 142 may be any of a number of known resistivity switching materials, including anti-fuse dielectric, fuse, diode and anti-fuse dielectric arranged in series, a polysilicon memory effect material, a metal oxide or switchable complex metal oxide material, a carbon nanotube material, a grapheme switchable resistance material, a phase change material, a conductive bridge element, an electrolyte switching material, a switchable polymer material, and a carbon resistivity switching material. The resistivity switching storage element 142 may be a single state or multi-state onetime-programmable, or re-writable cell featuring two terminals.

In operation of a memory cell array such as illustrated in FIG. 1, the word line decoder 110 controls dual device drivers 113, 115, 117, 119, each of which drives one of the word lines 112, 114, 116, 118. Each of the dual device drivers 113, 115, 117, 119 may include a PMOS transistor 162 and an NMOS transistor 161 connected in parallel between the word line decoder 110 and one of the word lines 112, 114, 116, 118. In the illustrated example, the NMOS transistor 161 is connected (e.g., the source region of the NMOS transistor is connected) to a global word line select voltage source 170 (V(WL SEL)), and the drain is connect to a word line 112, 114, 116, 118. The memory cell array 100 may have a main supply voltage $V_{PP}$. The word line select voltage source 170 provides a word line select voltage equal to about ground voltage (GND), i.e., the ground voltage, although various relative voltages can be chosen to control the amount of leakage through the memory cells. Generally, the biasing voltages can be adjusted to account for the turn-on voltages of the memory cells. The word line unselect voltage source 160 (V(WL VSEL)) is about 1 V to about $V_{PP}$. Hence, when the word line decoder 110 applies a select control voltage to the dual device drivers 113, 115, 117, 119, each NMOS transistor 161 is activated and applies (e.g., via the NMOS drain) the word line select voltage to each of the word lines 112, 114, 116, 118, and the PMOS transistor 162 is deactivated. Conversely, when the word line decoder 110 applies an unselect control voltage to the dual device drivers 113, 115, 117, 119, the PMOS transistor 162 is activated (e.g., the word line unselect voltage source 160 is applied to the PMOS source) which applies the word line unselect voltage to the word lines 112, 114, 116, 118, and the NMOS transistor 161 is deactivated.

The top bit line decoder 120 controls top single device drivers 123, 125, 127. Each of the top single device drivers 123, 125, 127 comprises a PMOS transistor having a gate coupled to the bit line decoder 120, a drain (or source) coupled to a top bias generator circuit 183 (or bit line driver), and a source (or drain) that drives one of the top bit lines 122, 124, 126, respectively, in response to a signal applied to the gate. The bottom bit line decoder 130 similarly controls bottom single device drivers 132, 134, with each of those single device drivers being a single PMOS transistor with similar connections to the bottom bias generating circuitry driving one of the bottom bit lines 133, 135, respectively. Each of the single device drivers 123, 125, 127, 132, 134 includes a PMOS transistor 163. A body 189 of each of the PMOS transistors 163 may be connected to $V_{PP}$ (V(PMOS Bias)).

Each of the top single device drivers 123, 125, 127 can be connected to a top bias generator circuit 183 by a top select bus 181 (TOP_SELB). The top bias generator circuit 183 can be connected to a bit lines select voltage source 195 (V(BL SEL)) and a bit line unselect voltage source 190 (V(BL UNSEL)). The bit line select voltage source 195 may be equal to about $V_{pp}$. The bit line select voltage source 195 provides a bit line select voltage of about 1 V to about 12 V. The bit line unselect voltage source 190 may provide a bit line unselect voltage of about −1 V to about 1 V. The bit line unselect voltage source 190 voltage is equal to about the word lines select voltage source 170 voltage. Thus, the top bias generator circuit 183 can connect either the bit lines select voltage source 195 or the bit line unselect voltage source 190 to the top select bus 181. Each of the bottom single device drivers 132, 134 can similarly connect the bit line select voltage source 195 or the bit line unselect voltage source 190 to the bottom select bus 182 and a bottom bias generator circuit 184 (BOTTOM SELB). Alternatively, the bit line select voltage sources for the top and bottom device drivers may be provided separately.

In an embodiment, the top bit lines 122, 124, 126 may be interleaved with the bottom bit lines 133, 135. This arrangement enables the coupling capacitance from a selected bit line to be interleaved with bit lines that are driven from the opposite side of the memory cell array. In a further alternative, only bit line decoder 120 may be provided so that only one set of single device drivers (e.g., the top single device drivers) is provided in the memory cell array. To simplify the description of the various embodiments, subsequent figures illustrate portions of memory cell array including only a single bit line decoder. Although to simplify the descriptions only one wordline decoder is shown in FIG. 1 and subsequent figures, other embodiments may include a second wordline decoder on the opposite side of the memory cell array from the illustrated wordline decoder, and additional word lines driven by word line driver circuits on the opposite side of the memory cell from the illustrated word line drivers. Other geographies may also be used.

In a further alternative, the orientation of the memory cells 140 may be reversed so that their anodes and cathodes are interchanged. The PMOS transistors may be replaced with NMOS transistors, and vice versa. Hence, the select and unselect voltages may be reversed in polarity. In a further alternative, the top and bottom single device drivers, and the dual device drivers may be optionally configured with pull-up or pull-down resistors.

Figure 2:
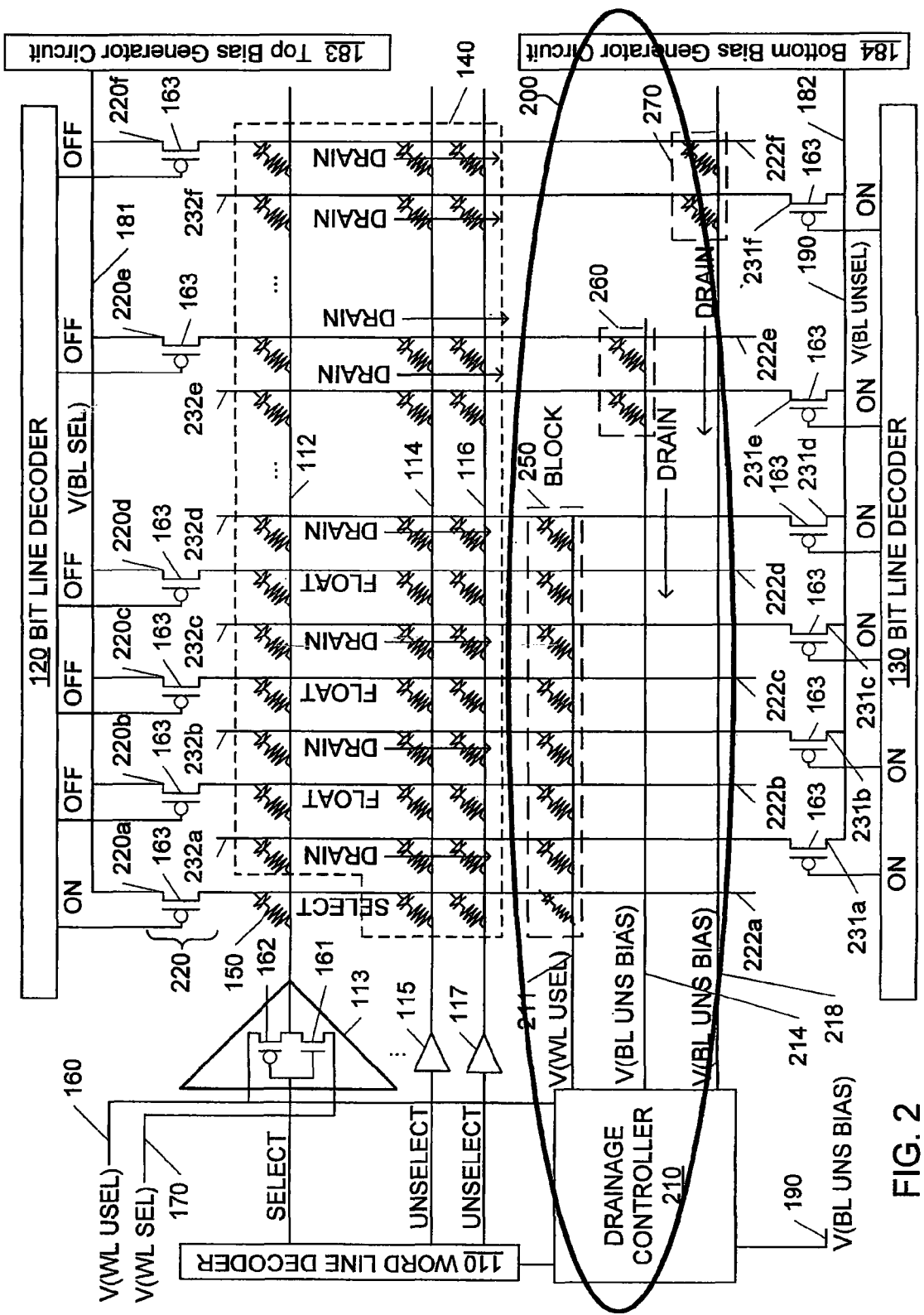
FIG. 2 is a diagram of a memory cell array with a previously developed circuit for coupling drainage lines to the memory cell array illustrated in FIG. 1 illustrating circuitry that may be replaced by implementing the various embodiments.

In memory cell arrays including diodes 141 and resistivity switching storage elements 142 as illustrated in FIG. 1, there may be a need to drain the charge out of bit lines in order to improve the efficiency of the memory array. A previously developed circuit for accomplishing this is illustrated in FIG. 2, which is substantially similar to FIG. 14 from U.S. patent application Ser. No. 12/385,964 incorporated herein by reference above. This memory cell array includes a word line decoder 110, a top bit line decoder 120, a bottom bit line decoder 130, word lines 112, 114, 116, top single device drivers 220a-220f (collectively 220) coupled to top bit lines 222a-222f, bottom single device drivers 231a-231f coupled to bottom bit lines 232a-232f, and memory cells 140 coupled between the bit and word lines, each of which are described above with reference to FIG. 1. In the embodiment illustrated in FIG. 2, the memory cell array also includes a drainage controller 210 and drainage lines 205 configured to drain charge out of the bit lines.

In the memory cell array shown in FIG. 2, a drainage controller 210 coupled to drainage lines 214, 218 may be electrically coupled to the bit lines 222a-222f, 232a-232f by drainage cells 250, 260, 270. The drainage controller 210 may communicate with the word line decoder 110 and the bit line decoders 120, 130 so that the drainage controller can determine which of the drainage lines 211, 214, 218 to activate and when. The drainage cells or blocks of cells 250, 260, 270 can be physically identical to the memory cells 140. Alternatively, the drainage cells or blocks of cells 250, 260, 270 may be used specially constructed for the purpose of bringing voltage from the bit lines; for example, a drainage cell may be only a diode without a resistivity storage element.

In the memory cell array shown in FIG. 2, each of the drainage lines 211, 214, 218 is coupled to a group of bit lines. For example, the bit lines in a group may be contiguous on and/or across memory levels; however, the bit lines in a group may be spread out. In one example, the bit lines may be divided into eight groups, however, any number of groups may be used. In the example shown in FIG. 2, three groups of eight-memory cell arrays are shown. For example, FIG. 2 shows one group of bit lines 222a-222d electrically coupled to one drainage line 211 by one group or block of drainage cells 250. As shown in FIG. 2, every drainage line is electrically coupled to some, but not all bit lines via drainage cells. Preferably, the drainage groups are mutually exclusive; however, the groups may overlap or be interlaced.

In the memory cell array shown in FIG. 2, the drainage controller may apply either a blocking voltage, such as the word line unselect voltage (V(WL UNSEL)), or a bit line unselect voltage to the drainage lines. When any of the drainage lines 211, 214, 218 is held at the bit line unselect bias voltage (V(BL UNS BIAS)), any charge with the potential of greater than the bit line unselect bias voltage plus the threshold voltage that is on the respective bit lines will leak through the drainage cells to the drainage line.

While the drainage controller 210 included in the memory cell array design shown in FIG. 2 can function to the maintain the proper bias voltages on the unselected bit and word lines, the additional circuitry 200 associated with the drainage controller 210, drainage cells 250, and associated electrical connections increases the size of the memory array, and adds undesirable additional complexity. Also, the memory array design illustrated in FIG. 2 uses a two-transistor word line driver which adds complexity and requires additional area to implement. Also, during reset and read operations, in the forward bias mode, unselected cell leakage may pull up half of the bit lines in a group so that they leak to the selected word line. Such leakage current sinking to the selected word line can cause large voltage drops due to the I*R of the current path. Also, the drainage cells 250 on bit lines used in blocks to control the floating bit lines and reduce leakage current by selected word lines add complexity. Additional drainage pillar devices are implemented only where the cells are crossed by the special word lines and the associated bit lines in the block. As result, if there are 8 special word lines, there are 8 additional groups of pillar devices, each group only associated with one special word line.

The various embodiment circuits described below replace the drainage controller 210 in the memory cell array design shown in FIG. 2, providing a simpler, easier to implement and smaller circuit for draining voltage from the unselected bit and word lines. As described in more detail below, the PMOS device 162 in the word line driver may be eliminated and a single NMOS device 161 may be used as the word line driver 113. As shown in subsequent figures, a bit line bleeder diode controller 314 (e.g., an NMOS transistor 314) is added to each bit line decoder selection circuit and connects by a zia 306a, 306b to a word line level where a special word line segment couples to bleeder diodes 300. Each bit line decoder output may be coupled to a large number of bit lines, such as 2 to 64 bit lines, but only one bit line side bleeder diode controller 314 (e.g., an NMOS transistor) is required for each block of 2 to 64 bit lines associated with a single bit line decoder selection output. Similarly, a word line bleeder diode controller 614 (e.g., a PMOS transistor 614) is added to each word line decoder selection circuit and connects to a bit line level where a special bit line segment couples to bleeder diodes 600. For example, 16 bit lines and bit line single device driver PMOS transistors are coupled to each single bit line decoder output are shown in the embodiments illustrated in the figures below, each of which is associated with a single bit line bleeder diode controller (e.g., a single NMOS transistor). There may be as many bit line bleeder diode controllers (e.g., NMOS transistors) as there are outputs from the bit line decoder, representing a small block of NMOS transistors compared to the drainage controller described above. Similarly, there may be as many word line bleeder diode controllers (e.g., PMOS transistors) as there are outputs from the word line decoder. The bit line bleeder diode controllers (e.g., NMOS transistors) can be locally laid out next to each other along the control lines of the bit line controller in the substrate below the memory array The bit line bleeder diode controller and the word line bleeder diode controller may have a control input lead, a source lead and an output lead. In embodiments in which the bit line bleeder diode controller is an NMOS transistor and/or the word line bleeder diode controller is a PMOS transistor, the control input lead may be a connection to the gate of the transistor, the source lead may be either the drain or source of the transistor, and the output lead may be the other of the source or drain of the transistor. The bit line bleeder diode controller may be implemented within the memory array so that each bit line bleeder diode connects a bit line (such as bit line 1 (BL1)) to the output lead of the bit line bleeder diode controller (e.g., the drain (or source) of an NMOS transistor) via a special word line and a zia. The source lead of the bit line bleeder diode controller (e.g., NMOS transistor source (or drain)) is coupled to a low voltage bias Vubl voltage source, thereby coupling the bleeder diodes to a low bias voltage. The bit line bleeder diode controller (e.g., an NMOS transistor) has a control input lead (e.g., a gate) which is coupled to gates of the PMOS transistors by a bit line decoder output lead. The PMOS transistors connect the bit lines to the bit line bias generator circuit using a group of bit line driver output leads. A complementary circuit may be employed on the word line side, with a word line bleeder diode controller (e.g., a PMOS transistor) coupling the bleeder diodes connected to the controller output lead to an unselected word line bias voltage source connected to the controller source lead, with the control input to the word line bleeder diode controller (e.g., PMOS transistor gate) coupled by a word line decoder lead to gates of word line single device driver NMOS transistors.

This circuit requires much less area than the drainage controller and drainage devices of FIG. 2. Also, the bleeder diodes are controlled by the same output from the bit line decoder that selects bit lines. When a PMOS transistor is selected by the bit line decoder for a particular bit line decoder selection circuit to select a particular group of bit lines, the associated bit line bleeder diode controller (e.g., an NMOS transistor) allows the connection in the memory array to the 16 bleeder diodes to float, so it does not try to supply any bias voltage. However, the bit line bleeder diode controller (e.g., an NMOS transistor) associated with all of the non-selected bit lines couples the unselected bit lines to the unselect voltage bias. No other special unselected bias device is required. Thus, the need for a separate controller circuit, such as a drainage controller, is eliminated from the memory array design.

The bit line bleeder diode controller and the word line bleeder diode controller may be any circuit that can connect respective bleeder diodes to the appropriate bias voltage in response to the same selection signal issued by the bit or word line decoder for selecting particular bit or word lines for reading/writing. In a first embodiment that is used to illustrate the invention in the figures and subsequent description, the bit line bleeder diode controller is an NMOS transistor (designated transistor 314 in the figures), and the word line bleeder diode controller is a PMOS transistor (designated transistor 614 in the figures). While this is a preferred embodiment, it is not the only type of controller circuit that may be used in the various embodiments. For purposes of simplifying the disclosure references to the NMOS transistor 314 and PMOS transistor 614 are intended to encompass all other suitable types of controller circuits for coupling bit line bleeder diodes and word line bleeder diodes, respectively, to the appropriate bias voltage source. For example, the types of transistors used for bit and word line bleeder controllers may be switched. As another example, other types of transistors may be used as the controllers. Further, other types of control circuits may be used for the bit and word line bleeder controllers including, for example, switches, diodes, Josephson junctions, bipolar transistors, etc. Therefore references to the NMOS transistor 314 and PMOS transistor 614 in the drawings and the following description are not intended to limit the scope of the claims to particular types of bit or word line bleeder diode controller circuits except as specifically recited in the claims.

The various embodiments leave no floating columns by providing decoder controlled bleeder diodes on one of every set (e.g., a set of 16) of bit lines and/or word lines. Further, the column decoder controls the bleeder diodes on the bit lines, eliminating the need for a separate drainage controller circuit. As a result, the bleeder circuits require less area than multiple word lines for drainage control. Also, the embodiments enable a single device word line driver in which the word line decoder controls the bleeder diodes (i.e., the row decoder controls the bleeder diodes on the word line). Thus, a set of bleeder diodes near the array and the driver zia area are connected to a bias line by a shared device controlled by a column or row decoder. The bleeder diodes determine the bias on unselected lines in the array when the decoder output is in the unselected state, i.e., the single device driver devices are off. One or both of the bit line and word line unselected bias is determined by such diode arrangement. The biasing is used in Read, Reset and Set modes of operation of the memory cell as described below with respect to FIGS. 10 and 11.

In the embodiments illustrated in FIGS. 1 and 2, the gate of each single device transistor 163 in a set is connected to a different bit line decoder 120 output, and the sources of each transistor 163 are connected to the same output 181 of the bias generator circuit 183. In many embodiments there will be sets of single device drivers each connected to a different bit line, with the sources of each of the set of single devices connected to a separate output from the top bias generator circuit 183. This is often the case in tight pitched arrays and especially in tight pitched multiple layer arrays. Thus, in FIGS. 1 and 2, each device 163 may represent a set of single devices. In the embodiments illustrated in FIG. 3A-9C, the single device driver 163 is embodied as such a set of devices 163a, 163b, etc. In these embodiments, the gate of each single device transistor 163, 663 in a set of 16 transistors is connected to the same bit line or word line decoder 120, 110 output (e.g., leads) 322, 622. However, the source of every single device transistor 163, 663 is connected to a different output (804, selb1-16, selx1-2) of a bit line or word line bias generator circuit 304, 604.

Figure 3A:
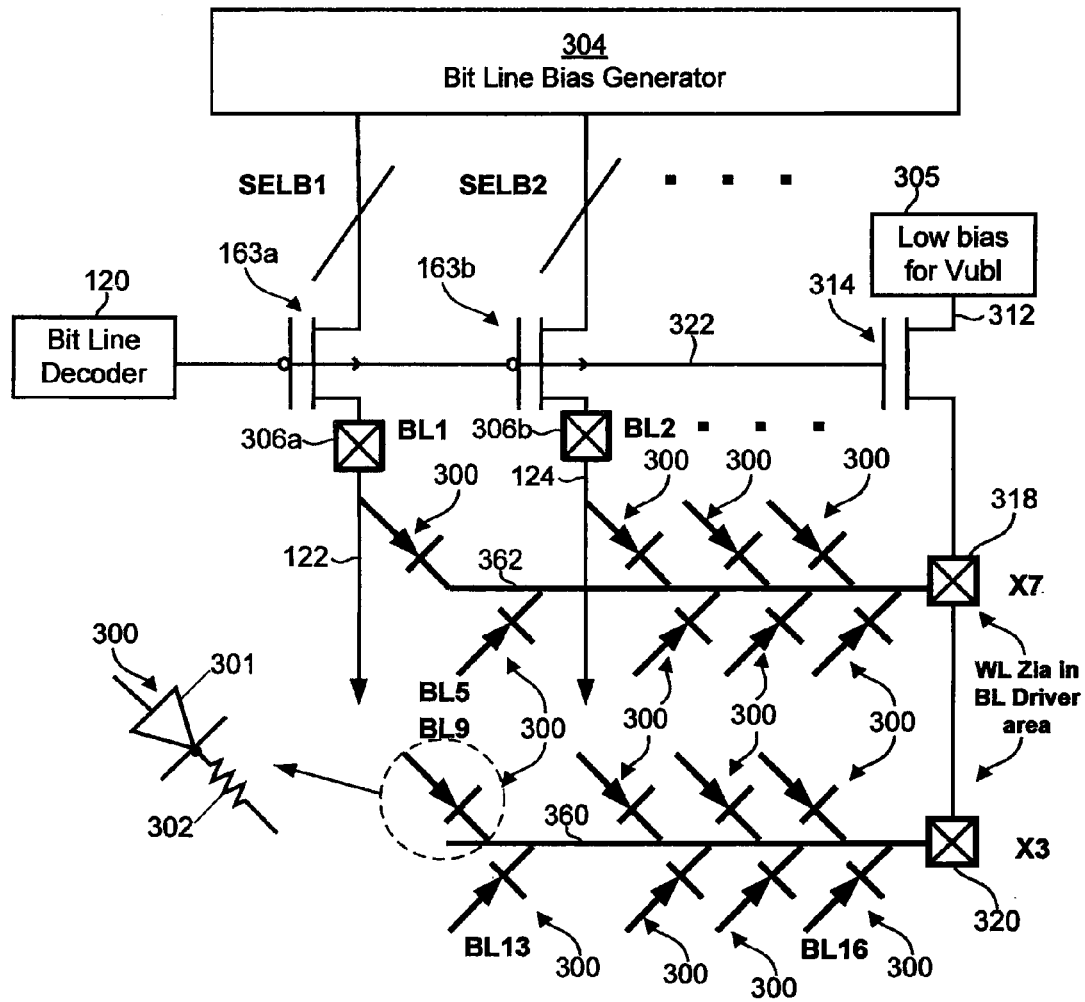
FIGS. 3A-3C are circuit diagrams of a portion of the memory cell array illustrating connections with a bit line decoder and a bit line bias generator circuit according to three embodiments.

FIG. 3A illustrates an embodiment showing details of the bit line side bleeder diode connection circuitry. Each bit line side bleeder diode 300 has a first terminal connected to one bit line 122, 124, and has a second terminal connected to one "special word lines" 360 in level X3, and 362 in level X7. Special word lines 360, 362 are not actual memory word lines because they are not connected to any word line driver, and instead are lines provided in a word line level in parallel to memory cell word lines to connect to the bit line bleeder diodes 300. Special word lines 360, 362 may be shorter than regular word lines 366 in the same word line level X3, X7. An NMOS transistor 314 is used to couple the bit line side bleeder diodes 300 through the special word lines 360, 362 and line 312 to a low-bias voltage Vubl source 305. The gate of the NMOS transistor 314 is coupled to the bit line decoder 120 output lead 322. Vubl may be temperature compensated because bias current through a diode is temperature dependent. The special word lines 360, 362 and bit line side bleeder diodes 300 may be positioned along an edge of the memory cell array. However, their structure and paths through the memory device are similar to those of word lines. In a preferred embodiment illustrated in FIG. 3A, the bleeder diodes 300 include the same structure as the memory cells 140, namely a current steering element 301, such as a diode, coupled to a dummy storage element 302. Any suitable two terminal passive devices may be used as the steering element 301. The current steering element 301 may be any of a number of known type of diodes, such as a p-n semiconductor diode, a p-i-n semiconductor diode, a punch through diode, a tunnel barrier diode such as a metal insulator metal (MIM) diode or a metal insulator-insulator metal (MIIM) diode, a resistor, a non-linear resistor, etc., as well as any current steering element that may be developed in the future. The dummy storage element 302 may be any of a number of known resistivity switching materials, which are permanently switched to their low resistance state, including anti-fuse dielectric, fuse, diode and anti-fuse dielectric arranged in series, a polysilicon memory effect material, a metal oxide or switchable complex metal oxide material, a carbon nanotube material, a graphene switchable resistance material, a phase change material, a conductive bridge element, an electrolyte switching material, a switchable polymer material, and a carbon resistivity switching material. Using the same structural materials for the bit line bleeder diodes 300 as the memory cells 140 enables the bleeder diodes to be fabricated in the same fabrication steps as the rest of the memory cell array. As described below with reference to FIGS. 12-14, bit line bleeder diodes 300 may be pre-formed after the fabrication step in a pre-forming step which transforms the resistivity switching material of the dummy storage element 302 into the irreversible low resistance state.

As noted above, each of the special word lines 360, 362 may be coupled through a zia 318, 320 (WL zia in BL driver area) to a low-voltage source 305, which is controlled by an NMOS transistor 314. The low bias voltage Vubl provided by the low-voltage source 305 (e.g., ground) is coupled to the drain of the NMOS transistor 314 via line 312. The gate of the NMOS transistor 314 is coupled to the bit line decoder 120 via the same output line or lead 322 from the bit line decoder 120 that controls the gates of a group (e.g., a group of 16) of bit line single device driver PMOS transistors 163a, 163b. When the bit line decoder 120 has not selected a group of bit lines, each of the deenergized (i.e., turned off) single device driver PMOS transistors 163a, 163b isolate their respective associated bit line from the selection voltage SEL B1, SEL B2 from the bit line bias generator 304, and simultaneously couples the special word lines 360, 362 to the low bias voltage 305 by energizing (i.e., turning on) the NMOS transistor 314. Thus, non-selected bit lines are subject to a low bias voltage through bleeder diodes 300 coupled to a special word line 360, 362. When the bit line decoder 120 selects a group of bit lines, the energized (i.e., turned on) single device driver PMOS transistors 163a, 163b couple their associated bit lines to the bit line selection voltage SEL B1, SEL B2 provided by the bit line bias generator 304, and decoder 120 simultaneously disengage the special word lines 360, 362 with from the low bias voltage 305 by turning off the NMOS transistor 314. Thus, selected bit lines are not subject to the bias voltage Vubl.

Figure 3B:
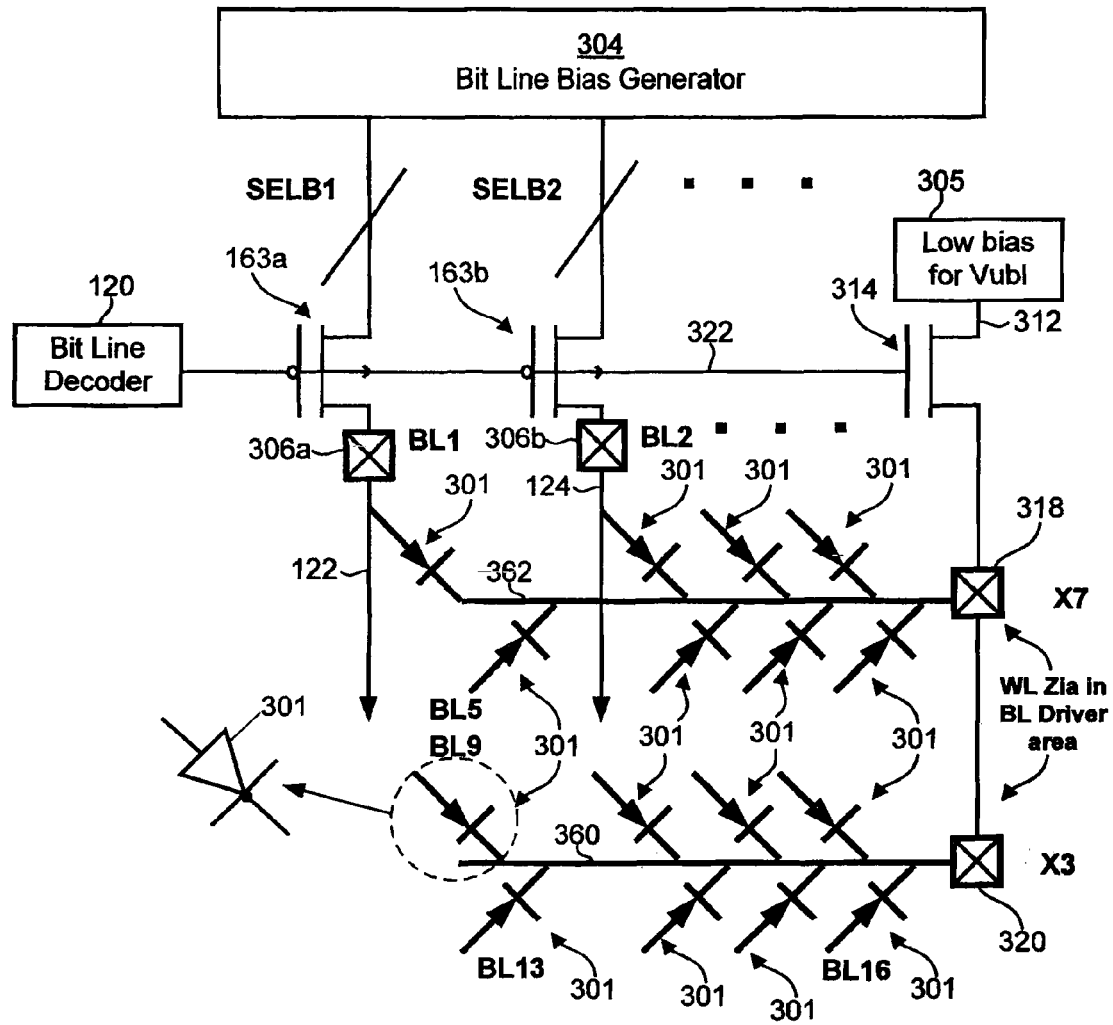

In an alternative embodiment illustrated in FIG. 3B, the resistivity switching material/dummy storage element 302 may be omitted, in which case the bleeder diode is simply a diode or similar current steering element 301. As with the embodiment illustrated in FIG. 3A, the current steering element 301 in the embodiment shown in FIG. 3B may any suitable two terminal passive device may be used as the steering element 301. The element 301 may be any of a number of known type of diodes, such as a p-n semiconductor diode, a p-i-n semiconductor diode, a punch through diode, a tunnel barrier diode such as a metal insulator metal (MIM) diode or a metal insulator-insulator metal (MIIM) diode, a resistor, a non-linear resistor, etc., as well as any current steering element that may be developed in the future. Other circuit elements shown in FIG. 3B may be the same as or similar to those described above with reference to FIG. 3A.

Figure 3C:
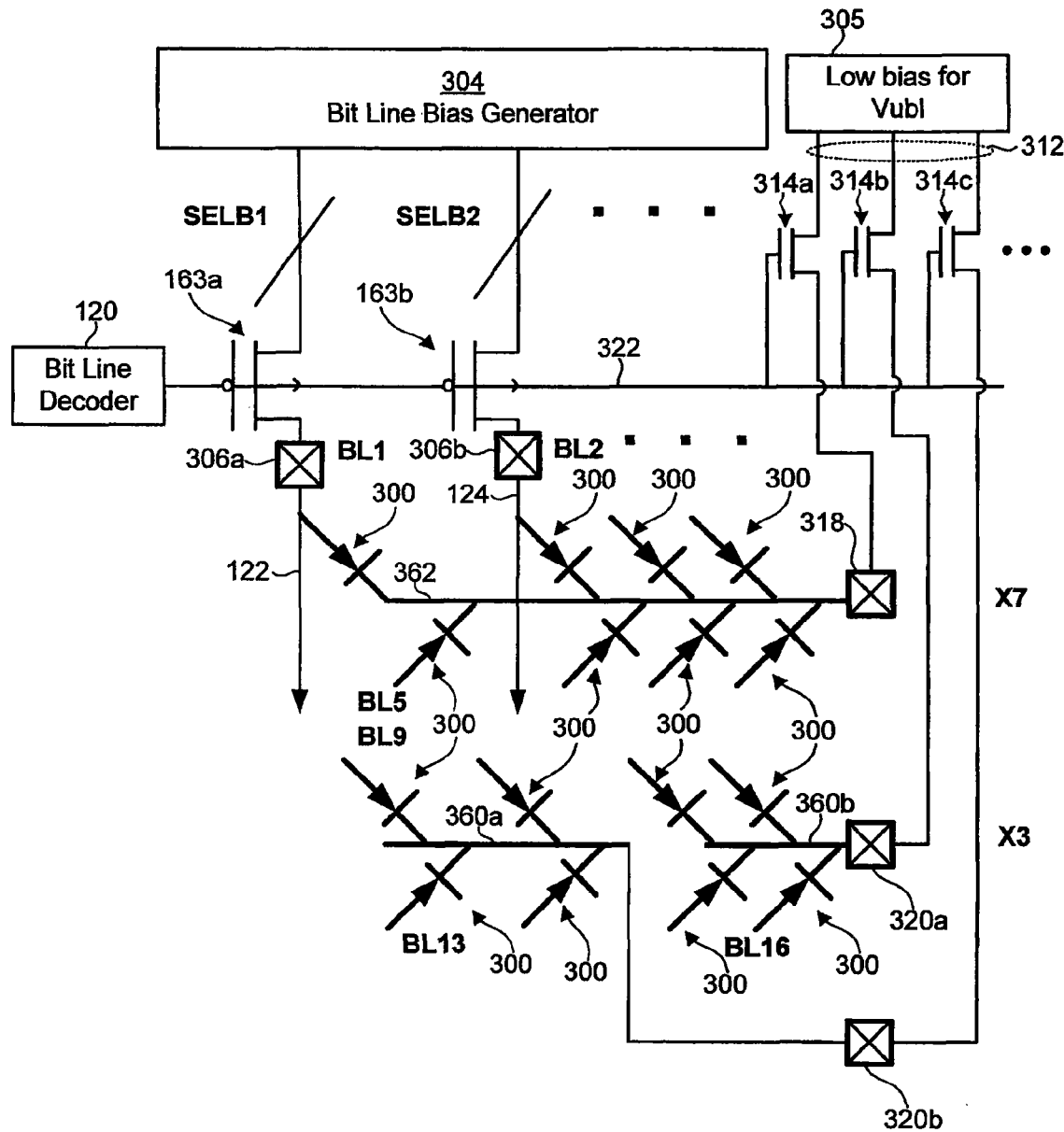

In a further embodiment illustrated in FIG. 3C, multiple NMOS transistors 314a, 314b, 314c may couple the bit line side bleeder diodes 300 to the low-bias voltage Vubl source 305 via respective special word lines 360, 362. The multiple NMOS transistors 314a, 314b, 314c in this embodiment replace the single NMOS transistor 314 illustrated in FIG. 3A. In this embodiment, a gate of each of the multiple NMOS transistors 314a, 314b, 314c may be coupled to the bit line decoder 120 output lead 322. In a further embodiment that is also illustrated in FIG. 3C, a special word line 360a, 360b may be coupled to each of the plurality of NMOS transistors 314b, 314c. For example, one NMOS transistor 314b may be configured to provide low bias voltage Vubl to four bleeder diodes 300 on the first portion of a special word line 360b, and a second NMOS transistor 314c may be configured to provide low bias voltage Vubl to four other bleeder diodes 300 on the second portion of a special word line 360a. A variety of different configurations may be used for connecting low bias voltage Vubl to special word lines and bleeder diodes 300 through a number of NMOS transistors 314.

Figure 4A:
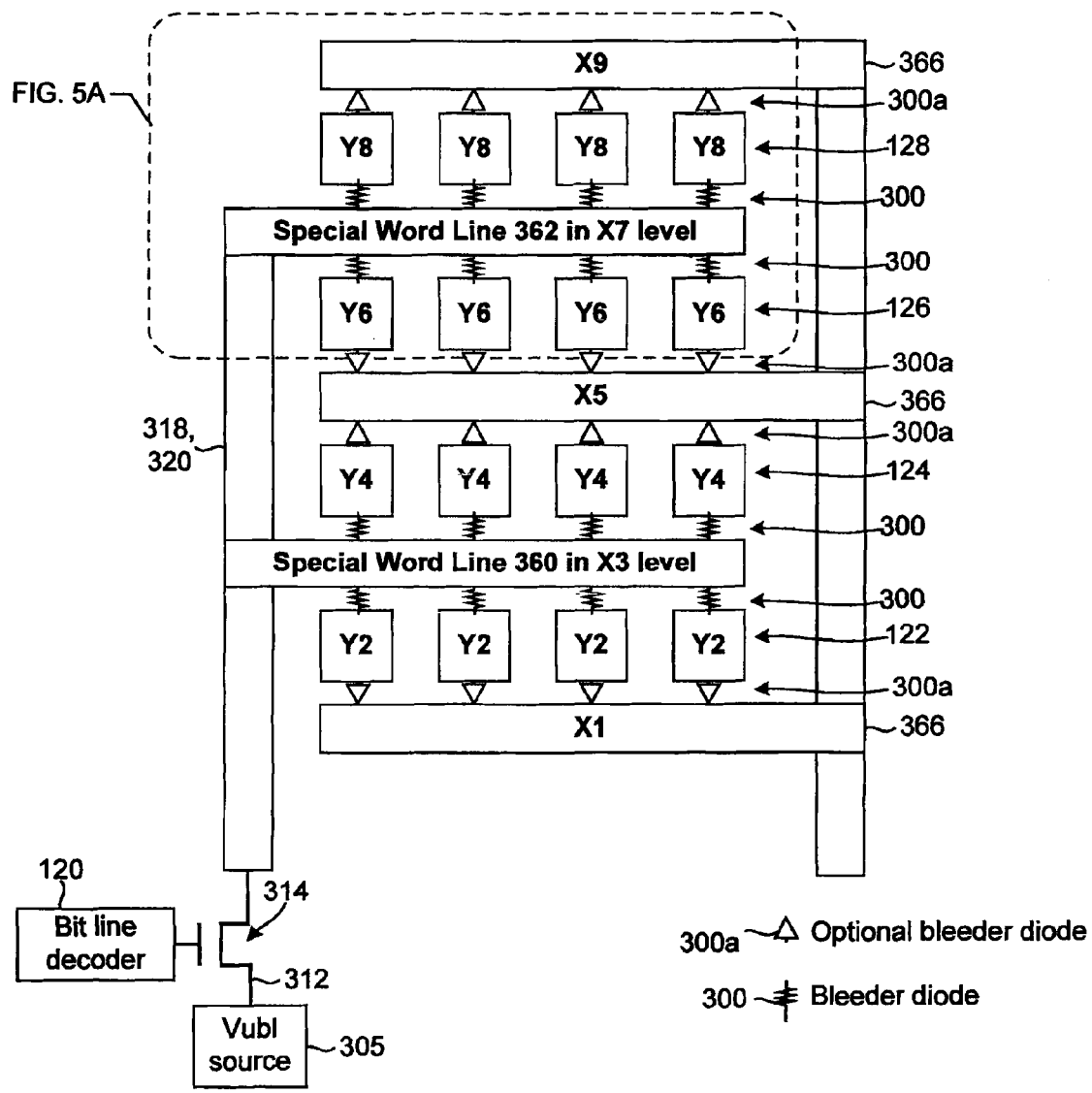
FIGS. 4A and 4B are side cross-sectional schematics of a 3-dimensional memory cell array illustrating the relationship of word lines and bit lines according to two embodiments.
Figure 4B:
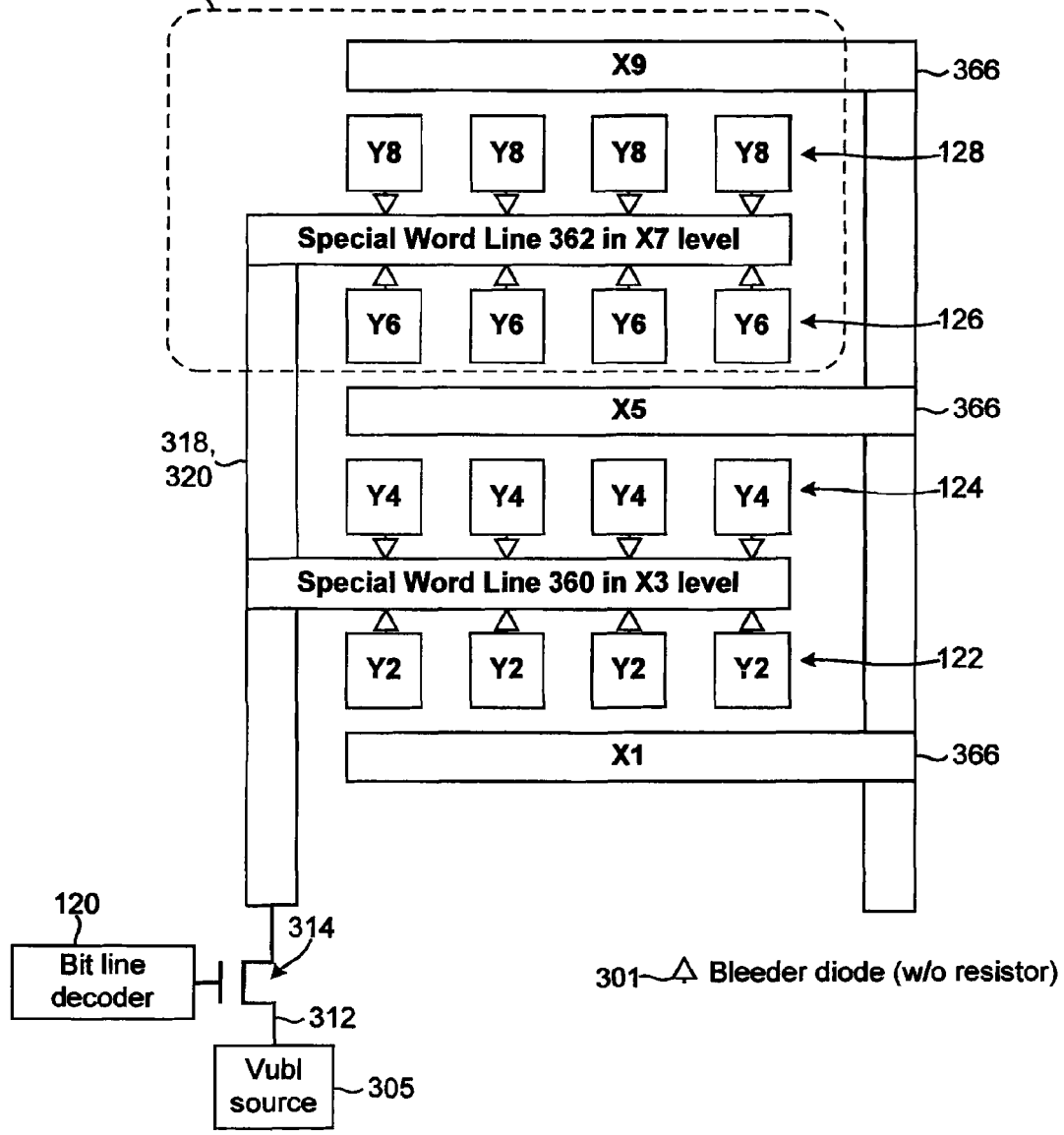

In a three-dimensional memory array device, the bleeder diodes 300, special word lines 360, 362, bit lines, and the NMOS transistor 314 may be configured in an arrangement such as that illustrated in FIGS. 4A and 4B. FIGS. 4A and 4B are notional cross-sectional side views of a portion of a three-dimensional memory array device according to two embodiments. In the embodiment shown in FIG. 4A, the bleeder diodes 300 are configured as current steering elements 301 coupled to dummy storage elements 302 (as described above with reference to FIG. 3A), while in the embodiment shown in FIG. 4B, the bleeder diodes are in the form of current steering elements 301 without dummy storage elements (as described above with reference to FIG. 3B).

In such a three-dimensional design, planar arrays or levels of memory cells may be coupled between one of a number of word lines 366 in word line levels X1, X3, X5, X7, X9 and one of a number of bit lines 122-128. Near the edge of the array and the bit line drivers, special cells of similar structure may be used as bleeder diodes 300 coupled between each of the bit lines in bit line levels Y2-Y8 and the special word lines 360, 362 positioned in word line levels X3, X7. As FIGS. 4A and 4B illustrate, the NMOS transistor 314 controlling the bleeder diodes may be coupled to the bit line decoder 120 and Vubl source 305 at a low level in or below the three dimensional memory array, such as in the substrate below the memory cells with the connections to the special word lines and bleeder diodes 300 provided by zias 318, 320a, 320b.

In an optional embodiment illustrated in FIG. 4A, a special word line may also be added in levels X1, X5 and/or X9 to double the number of bleeder diodes. The optional bleeder diodes are illustrated by triangles 300a in FIG. 4A. In this case special word lines X1, X5, X9 will also be connected to an NMOS transistor 314 (not shown separately).

Figure 5A:
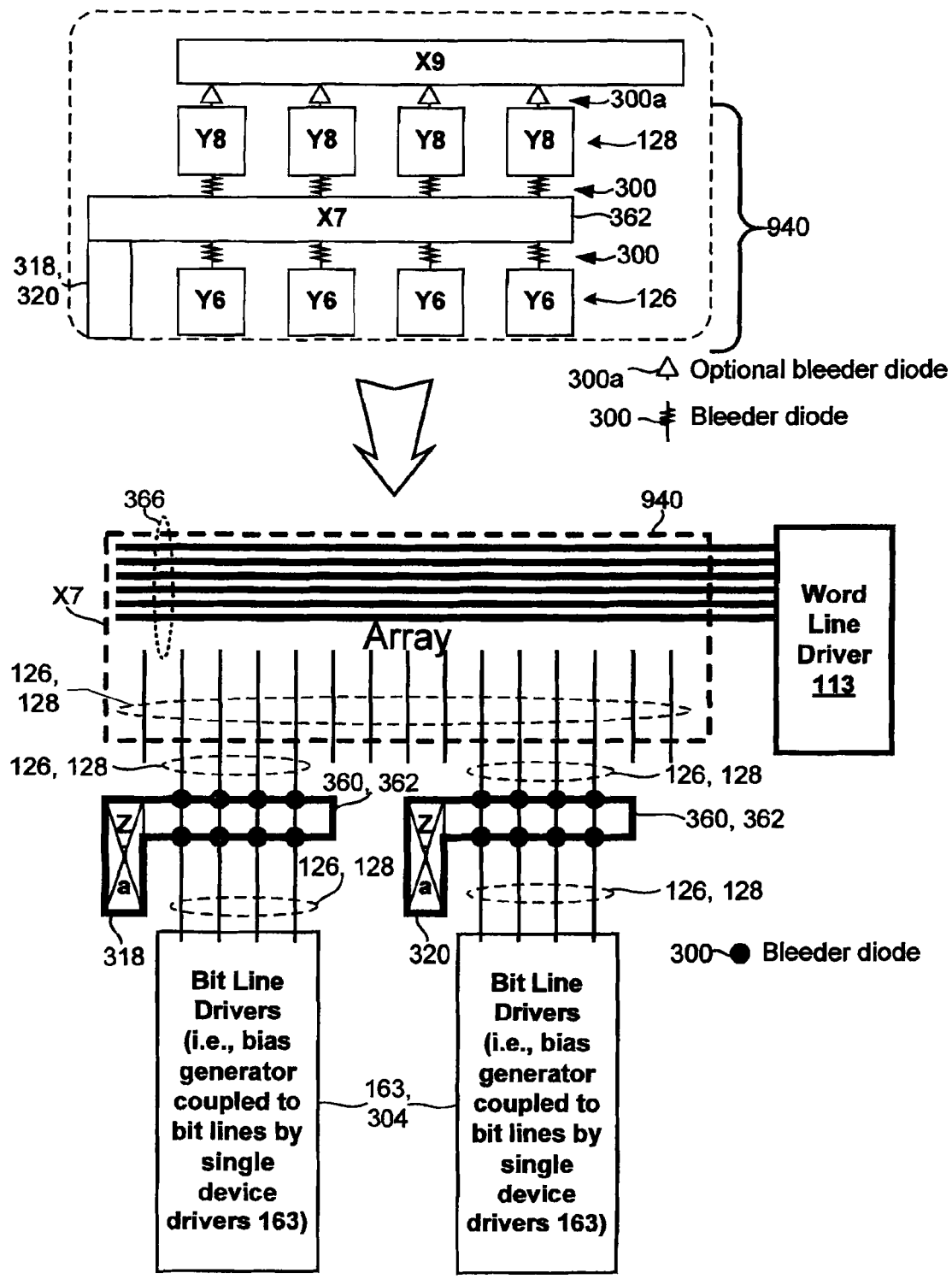
FIGS. 5A and 5B are block diagrams of components of a memory cell array illustrating locations of a portion of the components shown in FIGS. 4A and 4B from a top view perspective.
Figure 5B:
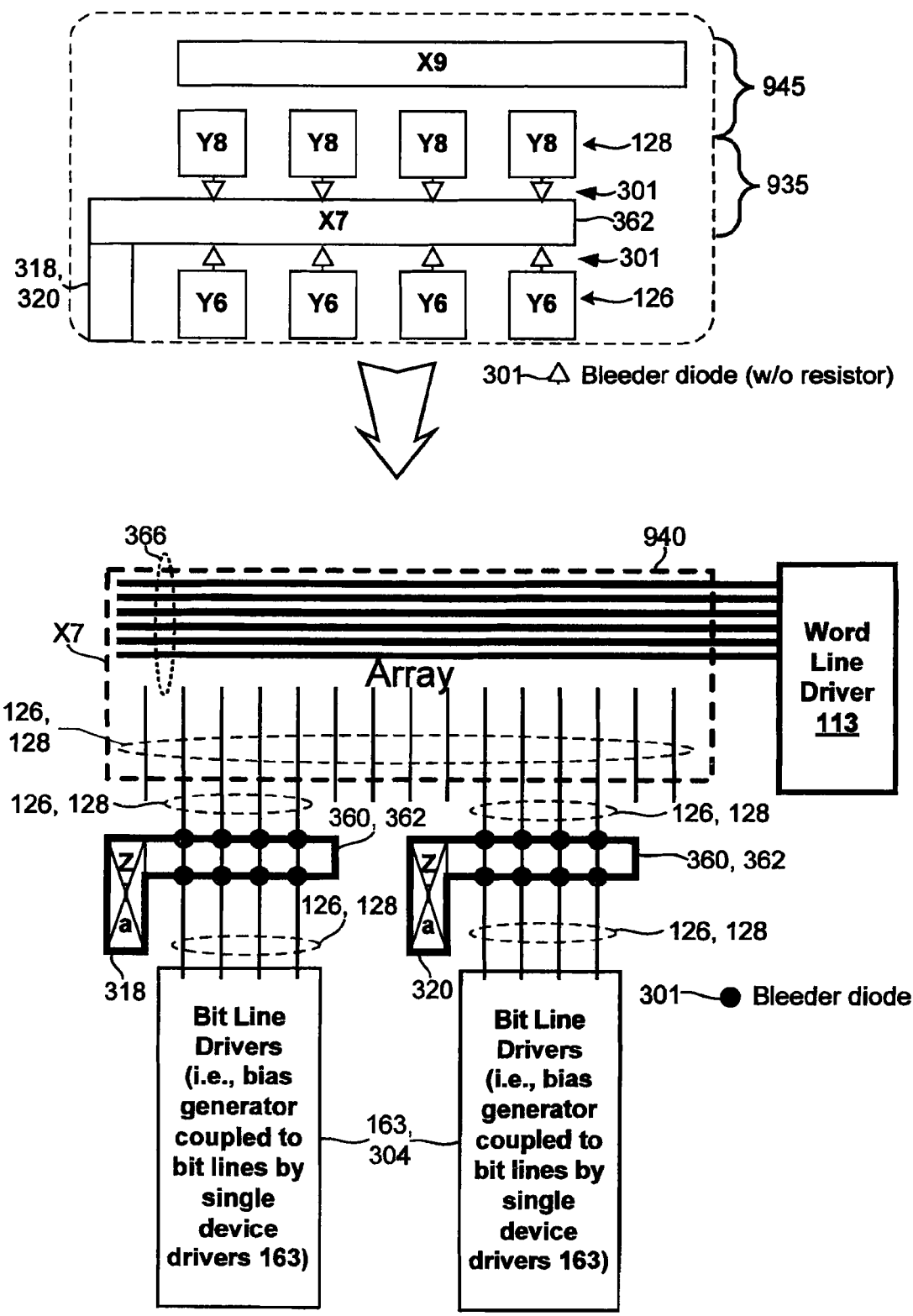

In order to better illustrate the interconnectivity within a three-dimensional memory array, a top perspective view of the encircled portion of FIG. 4A is illustrated in FIG. 5A, and a top perspective view of the encircled portion of FIG. 4B is illustrated in FIG. 5B. Referring to FIG. 5A, a memory cell array device level 940 may appear as a planar array when viewed from the top. Bit lines 126 spanning an array in bit line level Y6 and bit lines 128 spanning an array in bit line level Y8 may be coupled to the bit line bias generator 304 through zias shown in FIG. 9A. As mentioned above, the bit line bias generator 304 (e.g., bit line drivers (i.e., bias generator coupled to bit lines by single device drivers 163)) may be at a bottom level (e.g., in silicon substrate), while the memory array layers 935 (positioned between word line level 980 and bit line level 940 shown in FIGS. 9A and 9B) and 945 (positioned between bit line level 940 and word line level 990 shown in FIGS. 9A and 9B) may be at a top layer of the memory device. Also, as illustrated in FIGS. 5A and 5B, the bleeder diodes 300 may be formed in pairs near an edge of a level of memory cells 935, 945 where the bit lines 126, 128 cross the special word lines 360, 362. This configuration is advantageous in the case where the array lines are formed by a sidewall pitch doubling process which forms the special word lines 360, 362 in the shape of a loop as shown in FIGS. 5A and 5B. The special word line loop intersects but does not fully cover the zias 318, 320 to connect the special word line 360, 362 to the low bias voltage source 305. Even more diodes may be formed along the bit lines if desired to supply more current at a lower diode voltage drop. Bit lines in bit line levels 930, 940 (also labeled Y8 and Y6) may be coincident in the top view of FIGS. 5A and 5B, and no additional area may be needed for the multiple layers of bleeder diodes 300 for the multiple bit line layers 910, 920, 930, 940 (also labeled Y8, Y6, Y4, Y2). A further illustration of the interconnectivity of circuit elements in a three-dimensional memory array is illustrated described below in further detail with reference to FIGS. 9A-9C.

As discussed above with reference to FIG. 3B, the resistivity switching material/dummy storage element 302 may be omitted, in which case the bleeder diode is simply a diode or similar current steering element 301 as illustrated in FIG. 4B. FIG. 4B also shows an embodiment in which bleeder diodes 301 are only positioned between one word line level of word lines 360, 362 and the bit line levels below (bit line level 126) and above (bit line level 128) that word line level.

Figure 6A:
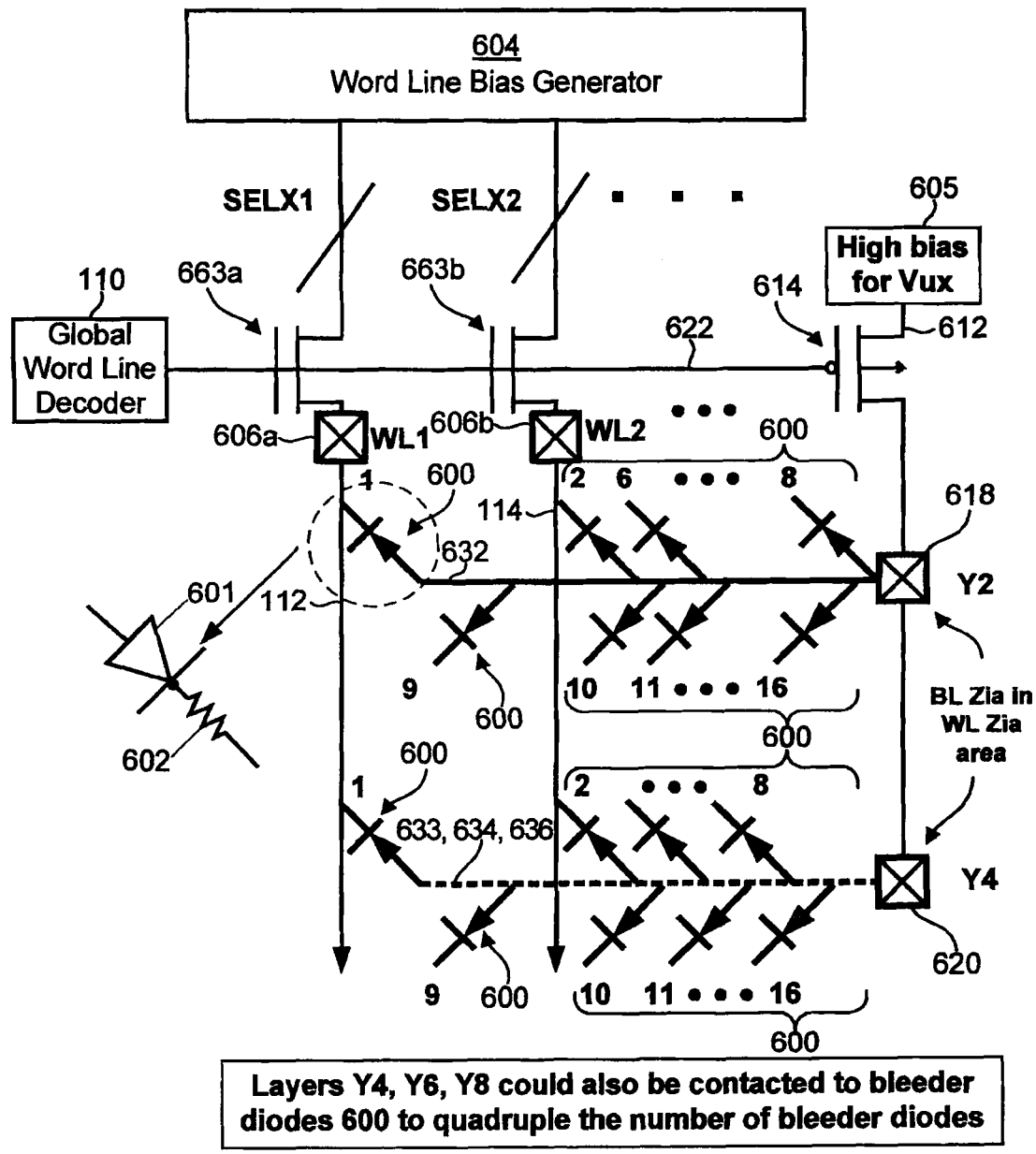
FIGS. 6A-6C are circuit diagrams of a portion of the memory cell array illustrating connections with the word line decoder according to three embodiments.
Figure 6B:
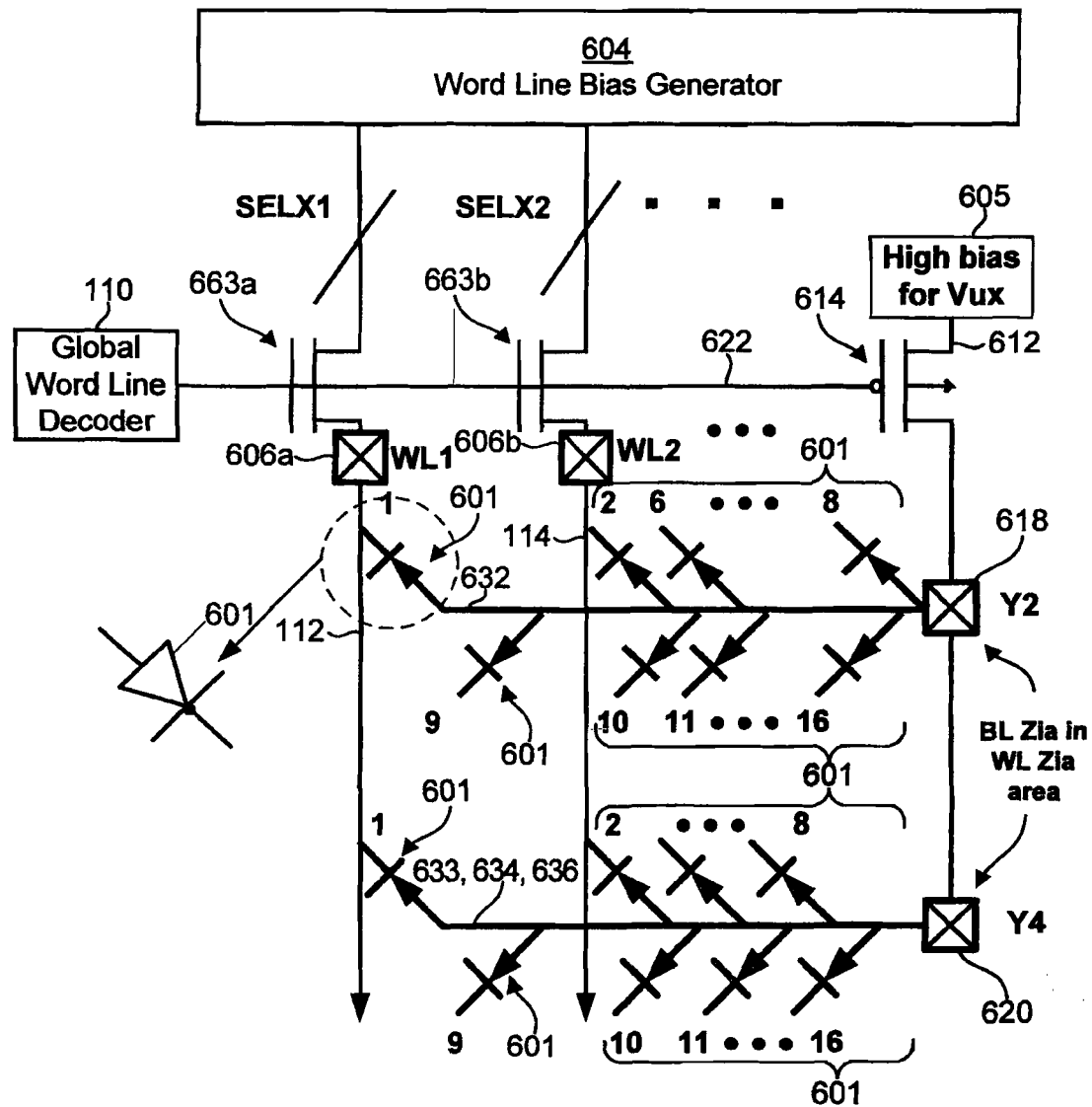

Similar but opposite polarity circuitry may be provided on the word line side, as illustrated in FIGS. 6A and 6B. In a first embodiment shown in FIG. 6A, the bleeder diodes 600 are configured as current steering element 601 coupled to dummy storage elements 602, while in the embodiment shown in FIG. 6B, the bleeder diodes are in the form of current steering element 601 without dummy storage elements. One word line bleeder diode 600 has a first terminal that is connected to a word line 112, and a second terminal connected to a special bit line 632 in the Y2 bit line level. Instead of an NMOS transistor 314 coupling the bleeder diodes 300 to a low bias voltage 305 as described above for the bit line side, a PMOS transistor 614 is used to couple word line bleeder diodes 600 through the special bit line 632 and line 612 to a high bias voltage Vux source 605. The high bias voltage Vux may be temperature compensated so that the diode drop is adjusted for the projected unselected cell leakage. The special bit line 632 is not an actual memory bit line because it does not connect to any memory cells, and instead is provided to connect the word line side bleeder diodes 600 to the high bias voltage source 605. Like the bit line side bleeder diodes 300, in an embodiment illustrated in FIG. 6A, the word line side diodes 600 may include the same structure as the memory cells 140, namely a current steering element 601 coupled in series to a dummy storage element 602. Any suitable two terminal passive devices may be used as the steering element 601. The element 601 may be any of a number of known type of diodes, such as a p-n semiconductor diode, a p-i-n semiconductor diode, a punch through diode, a tunnel barrier diode such as a metal insulator metal (MIM) diode or a metal insulator-insulator metal (MIIM) diode, a resistor, a non-linear resistor, etc. The dummy storage element 602 may be any of a number of known resistivity switching materials irreversibly switched to their low resistance state, including anti-fuse dielectric, fuse, diode and anti-fuse dielectric arranged in series, a polysilicon memory effect material, a metal oxide or switchable complex metal oxide material, a carbon nanotube material, a graphene switchable resistance material, a phase change material, a conductive bridge element, an electrolyte switching material, a switchable polymer material, and a carbon resistivity switching material. Using the same structural materials for the word line bleeder diodes 600 as the memory cells 140 enables the word line bleeder diodes to be fabricated in the same fabrication steps as the rest of the memory cell array. As described below with reference to FIGS. 12-14, word line bleeder diodes 600 may be pre-formed after the fabrication step in a pre-forming step which transforms the dummy storage material 602 into an irreversible low resistance state.

Referring to FIG. 6A, each of the special bit lines 632 in the Y2 bit line level and optional special bit lines 633, 634, 636 in the Y4, Y6, Y8 bit line levels may be coupled through a zia 618, 620 (e.g., BL zia in WL zia area) to the high voltage source 605 (that is, layers Y4, Y6, Y8 could also be contacted to bleeder diodes 600 to quadruple the number of bleeder diodes), which is controlled by at least one PMOS transistor 614. Word line zias 606a, 606b are also shown (and described below with regard to FIG. 7)). The high bias voltage Vux provided by the high-voltage source 605 (e.g., about 2 to 7 volts) is coupled to the drain of the PMOS transistor 614 by line 612. The gate of the PMOS transistor 614 is coupled to the word line decoder 110 via the same output control line or lead 622 from the word line decoder that controls the gates of a group (e.g., a group of 16) of word line single device driver NMOS transistors 663a, 663b. Thus, the same decoder output controls the selected lines and the bleeder diodes. When the word line decoder 110 has not selected a group of word lines, each of the deenergized (i.e., turned off) single device driver NMOS transistors 663a, 663b which decouple their respective associated word lines from the word selection voltage SEL X1, SEL X2 from the word line bias generator circuit 604, and the decoder simultaneously couples the special lines Y2 to the high bias voltage 605 by energizing (i.e., turning on) the PMOS transistor 614. Thus, non-selected word lines are subject to a high bias voltage Vux through bleeder diodes 600 (e.g., a group of 16, such as 1, 2 . . . 6 . . . 8 . . . 10, 11 . . . 16) coupled to special bit lines 632. When the word line decoder 110 selects a group of word lines, the energized (i.e., turned on) single device driver NMOS transistors 663a, 663b couple their associated word lines to the word selection voltage SEL B1 provided by the word line bias generator circuit 604, and decoder 110 simultaneously disengages the special bit lines from the high bias voltage 605 by deenergizing (i.e., turning off) the PMOS transistor 614. Thus, selected word lines are not subject to a bias voltage Vux from source 605.

While a preferred embodiment includes only a single special bit line 632 in the Y2 bit line level and global word line decoder 110, optionally additional special bit lines 633, 634, 636 may be provided in the Y4, Y6, Y8 bit line levels and used to connect to more word line bleeder diodes 600, which can quadruple the number of bleeder diodes implemented in the memory array device if desired.

In an alternative embodiment illustrated in FIG. 6B, the resistivity switching material/dummy storage element 602 may be omitted, in which case the bleeder diode is simply a diode or similar current steering element 601. As with the embodiment illustrated in FIG. 6A, the current steering element 601 in the embodiment shown in FIG. 6B may be any suitable two terminal passive device may be used as the steering element 601. The element 601 may be any of a number of known type of diodes, such as a p-n semiconductor diode, a p-i-n semiconductor diode, a punch through diode, a tunnel barrier diode such as a metal insulator metal (MIM) diode or a metal insulator-insulator metal (MIIM) diode, a resistor, a non-linear resistor, etc., as well as any current steering element that may be developed in the future. Other circuit elements shown in FIG. 6B may be the same as or similar to those described above with reference to FIG. 6A.

Figure 6C:
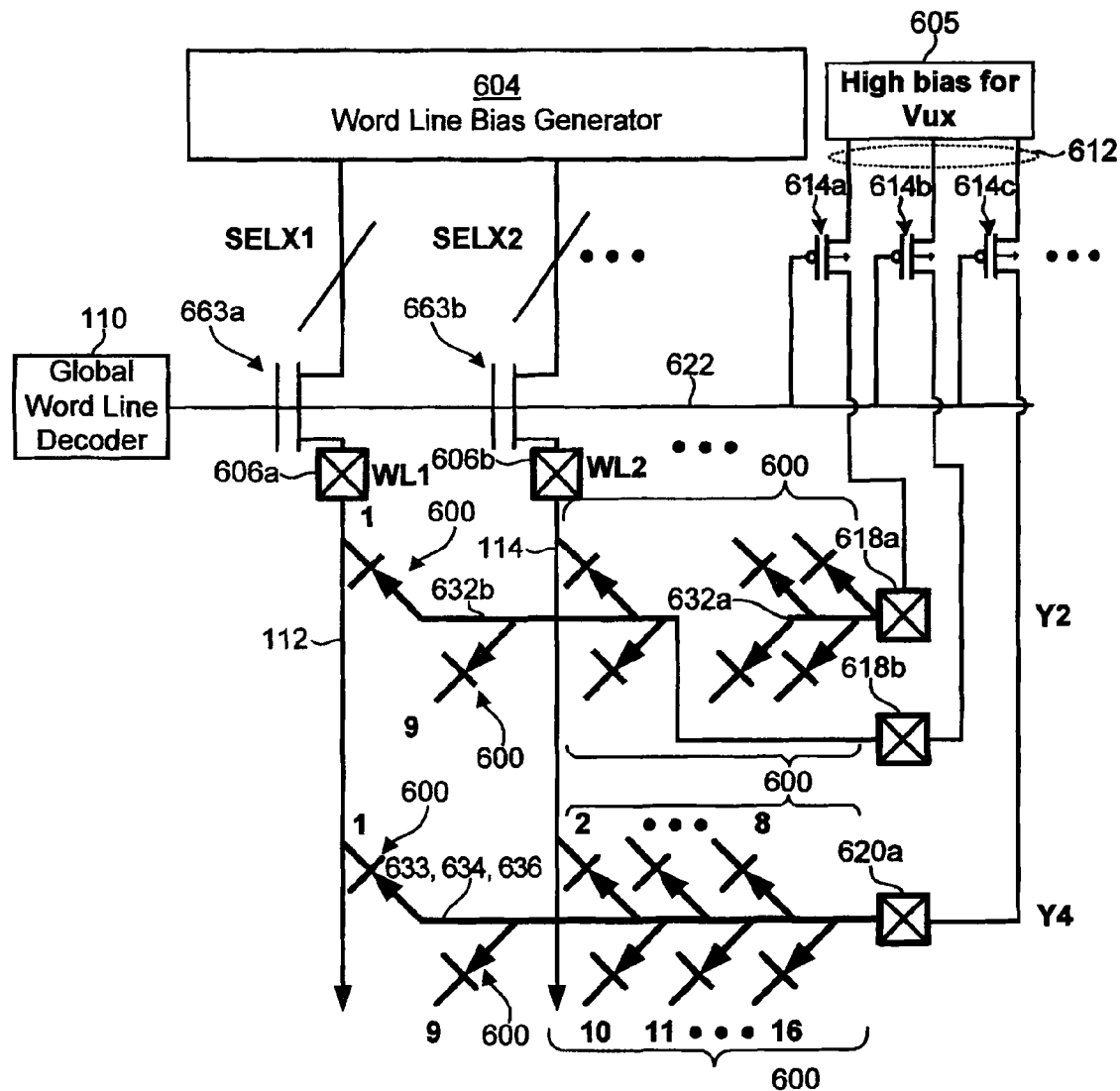

In a further embodiment illustrated in FIG. 6C, multiple PMOS transistors 614a, 614b, 614c may couple the word line side bleeder diodes 600 to the low high bias voltage Vux source via the 605 respective special bit lines 632. The multiple PMOS transistors 614a, 614b, 614c in this embodiment replace the single PMOS transistor 614 illustrated in FIG. 6A. In this embodiment, a gate of each of the multiple PMOS transistors 614a, 614b, 614c may be coupled to the word line decoder 110 output lead 622. In a further embodiment that is also illustrated in FIG. 6C, a special bit line 632a, 632b may be coupled to more than one PMOS transistor 614b, 614c. For example, one PMOS transistor 614b may be configured to provide high bias voltage Vux to four bleeder diodes 600 on the first portion of a special word line 632a, and a second PMOS transistor 614a may be configured to high bias voltage Vux to four other bleeder diodes 600 on the second portion of a special bit line 632a. A variety of different configurations used for connecting low bias voltage Vubl to special word lines and bleeder diodes 600 through a number of PMOS transistors 614.

Figure 7:
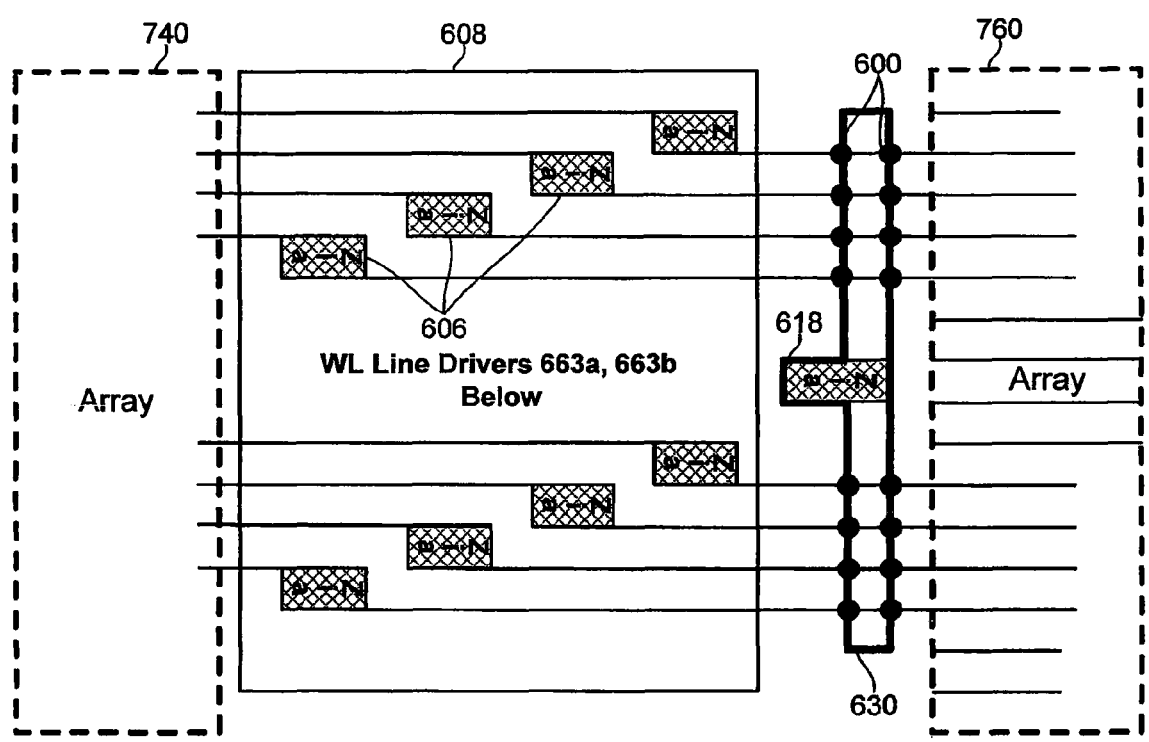
FIG. 7 is a block diagram of components of a memory cell array illustrating locations of word line components according to an embodiment.

In a three-dimensional memory cell array device, the word line single device drivers 663a, 663b may be positioned beneath the memory cell array levels (e.g., in substrate) as illustrated in FIG. 7, which shows a top view of a portion of the memory array and word line zias 606 configured within a word line zia area 608. As shown in this figure, the word line single device drivers positioned underneath the three-dimensional memory cell array may be coupled to the word lines in planar memory arrays 740, 760 through zias 606 which are located between two blocks of memory cells forming arrays 940, 960 which each consist of multiple levels of memory cells. FIG. 7 also illustrates how pairs of word line bleeder diodes 600 (shown as dots in FIG. 7) may also be coupled to the word lines and a special bit line 630 (shown as a heavy line in FIG. 7), and may further be coupled to a word line bias generator (not shown in FIG. 7) through a zia 618.

Figure 8A:
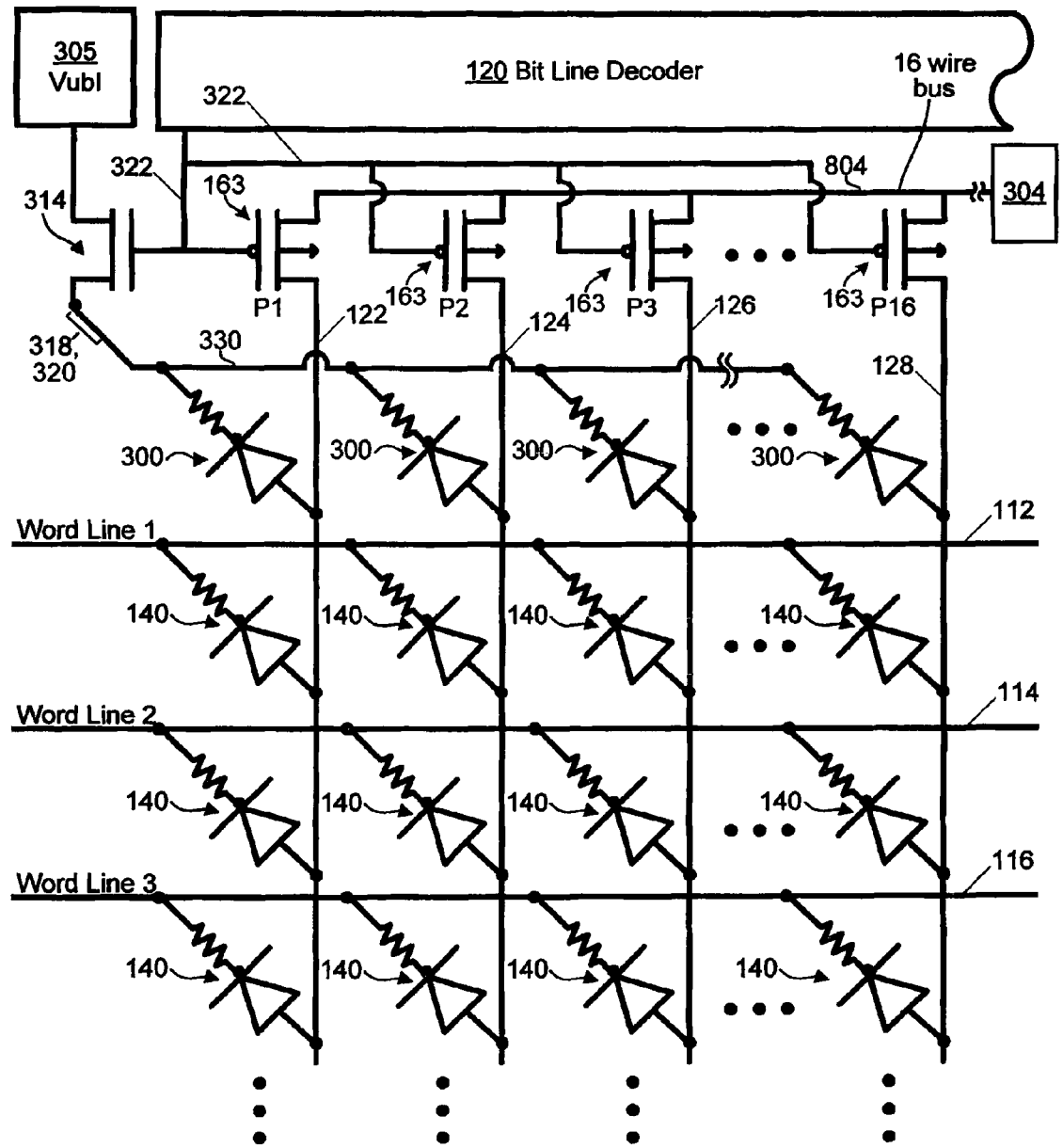
FIGS. 8A and 8B are circuit diagrams of a portion of the memory cell array illustrating connections between bleeder diodes and a bit line decoder according to two embodiments.
Figure 8B:
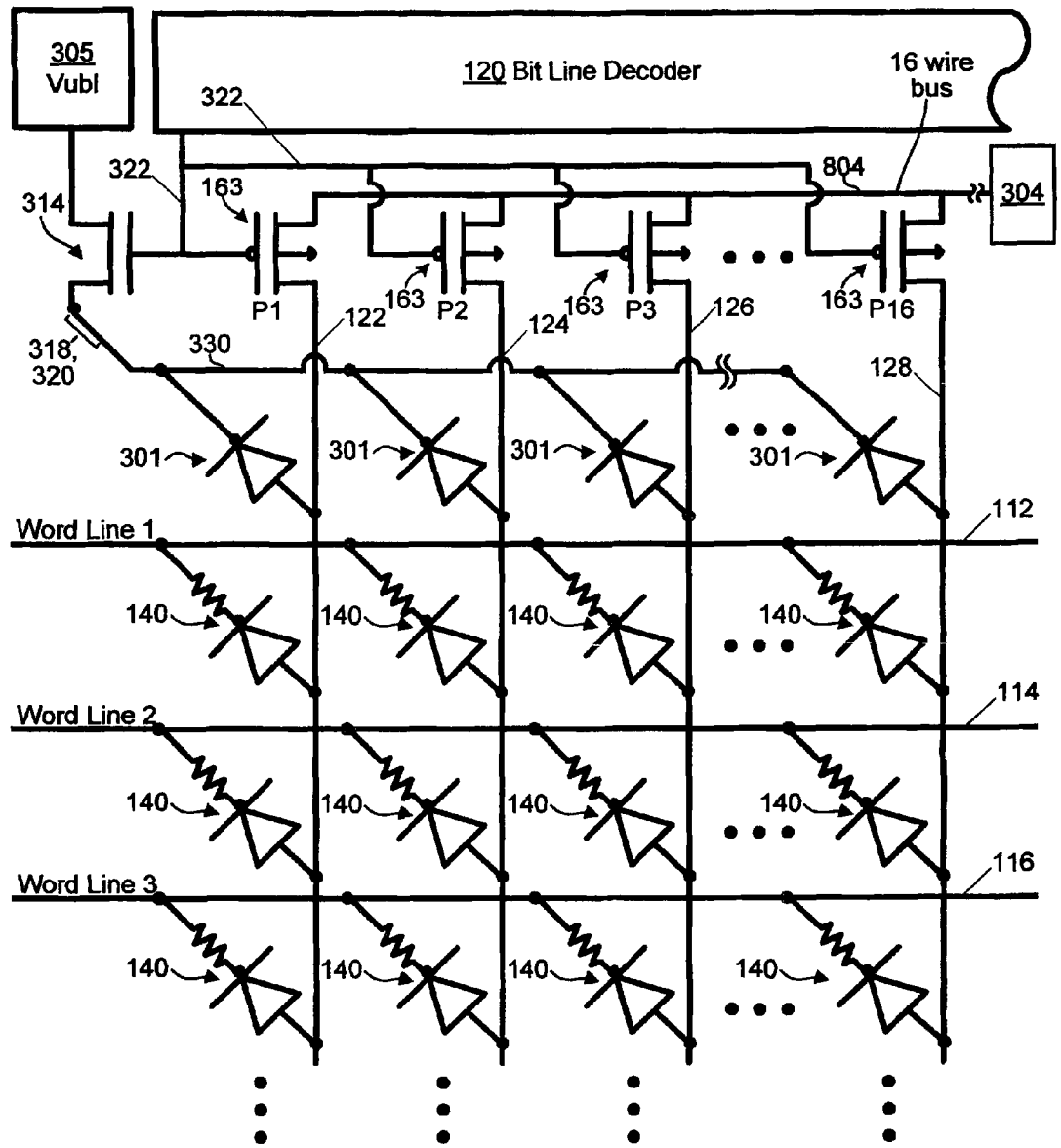

As mentioned above with respect to FIGS. 3A-5B, the NMOS transistor 314 whose drain (or source) is coupled to a bit line side bleeder diode 300 (NMOS transistor 314 may be referred to herein as the bit line bleeder diode control NMOS transistor 314) may have a gate coupled to a bit line group selection output line or lead 322 from the bit line decoder 120. This is illustrated in FIGS. 8A and 8B. The same line or lead 322 is also coupled to the gates of a group of bit line single device driver PMOS transistors 163 (labeled as transistors P1, P2, P3, . . . P16 in FIGS. 8A and 8B). The group may include 2-32 or even more PMOS transistors, such as 16 transistors. The PMOS transistors 163 may be connected to a bit line bias generator 304 through a line 804 (16 wire bus) in the form of a bus of lines (which is labeled as SELB in some figures), each connected to one of the PMOS transistors. FIGS. 8A and 8B also illustrates how bleeder diodes 300 may be coupled between the source (or drain) of the NMOS transistor 314 and each of the bit lines 122, 124, 126, 128 coupled to single device drivers 163 connected to a single bit line decoder output 322. As discussed above and illustrated in FIGS. 8A and 8B, this connection of the NMOS transistor 314 to the bit line bleeder diodes 300 may be through a zia 318, 320. The above described word line 1 (112) word line 2 (114) and word line 3 (116) are also illustrated. Thus, in the illustrated example embodiment, 16 bleeder diodes 300 are coupled to a single NMOS transistor 314 and to a set of 16 bit lines controlled by a single bit line decoder output 322. FIGS. 8A and 8B also illustrates how the drain of each of the single device controller PMOS transistors 163 (transistors P1, P2, P3, . . . P16) may be coupled to the bit line bias generator 304 via a 16-(or other number) wire bus 804. Thus, each PMOS transistor 163 is controlled by a different driver output.

The configuration of the PMOS transistors in FIGS. 8A and 8B having gates coupled to the same decoder 120 output 322 may be referred to as a "multiheaded driver devices". The total number of transistors is reduced from 2N in the prior art to N+1 in FIGS. 8A and 8B, where N is the "headedness" of the decoder (i.e., the number of PMOS transistors 163 in FIGS. 8A and 8B). This reduction in the number of transistors in the device drivers can save 25% or even more of the chip area for 3D arrays, especially when the block size is less than 4000 cells by 500 cells. The overhead of lines connected to the driver devices is also reduced.

In the embodiment shown in FIG. 8A, the bleeder diodes 300 are configured as current steering elements 301 coupled to dummy storage elements 302 (as described above with reference to FIG. 3A), while in the embodiment shown in FIG. 8B, the bleeder diodes are in the form of current steering elements 301 without dummy storage elements (as described above with reference to FIG. 3B).

Figure 9A:
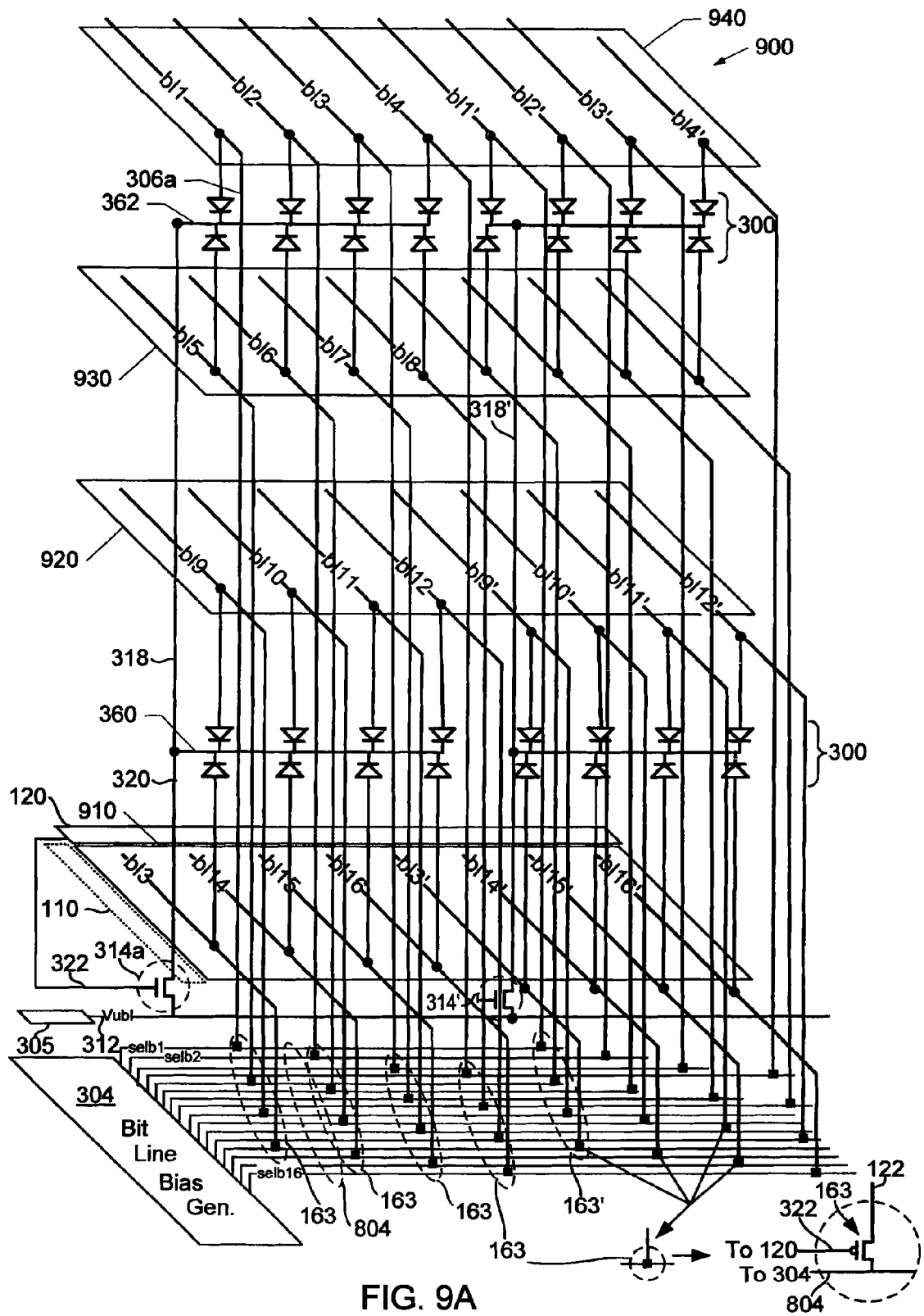
FIG. 9A-9C are three-dimensional circuit schematics illustrating how components of the various embodiments are interconnected among memory cell array layers according to an embodiment.
Figure 9B:
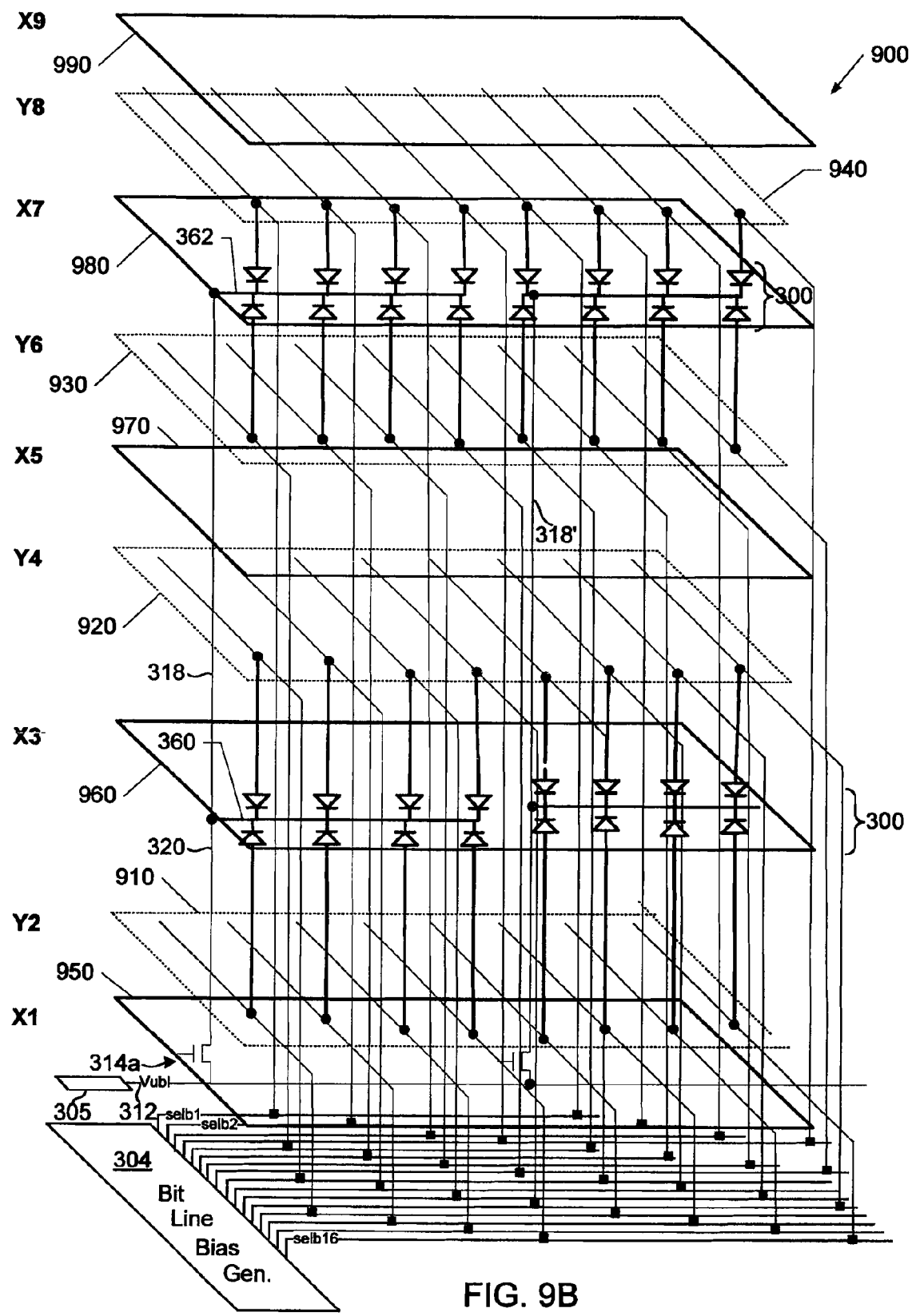
Figure 9C:
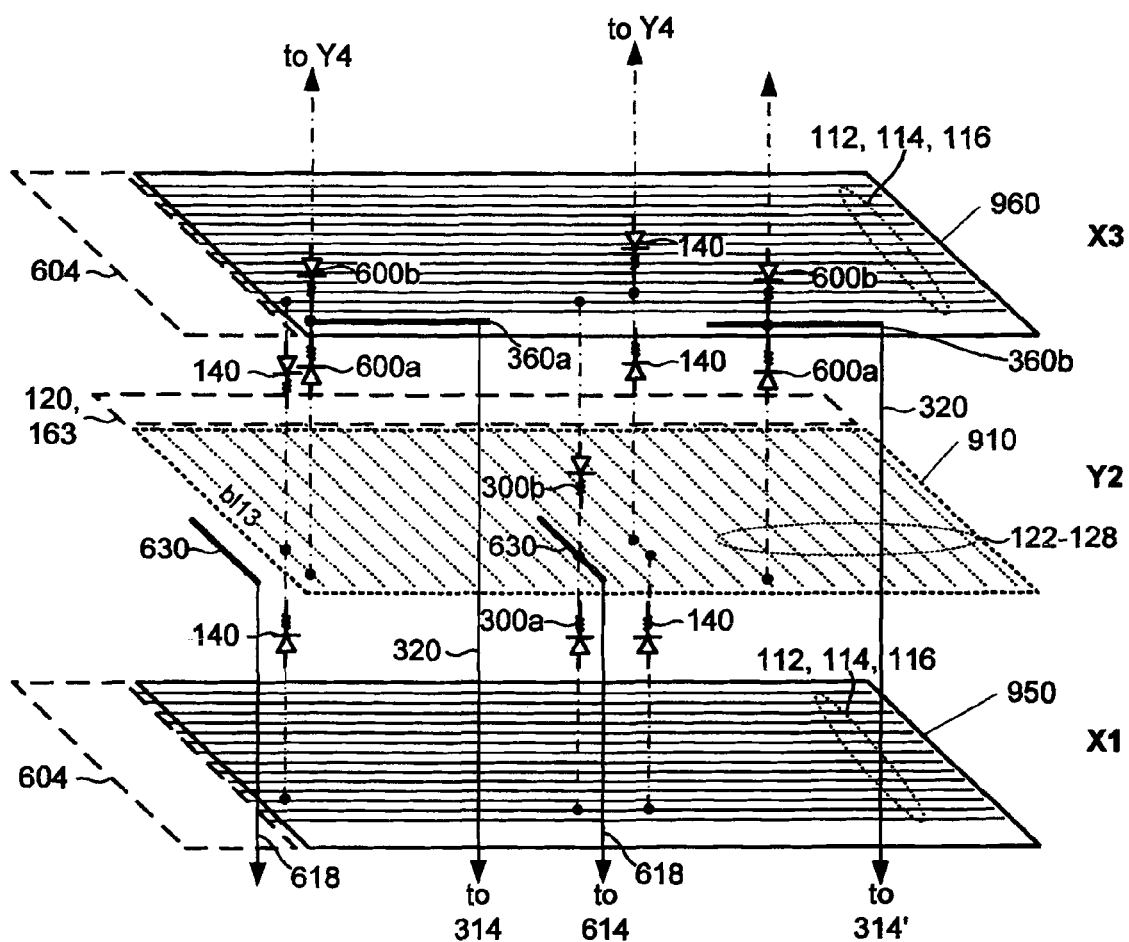

An example embodiment of a three-dimensional arrangement of circuit elements within a memory device 900 is illustrated in FIG. 9A. This example embodiment features a bit line bleeder diode 300 positioned in word lines levels X3 and X7 between bit line levels 910, 920, 930, 940 in the memory cell array. Details on the word lines side (e.g., word line bleeder diodes, word line decoders, word line drivers, and word lines) in memory cells 140 are not included in FIG. 9A in order to simplify the figure, but are shown in FIG. 9B which deemphasizes details associated with bit line levels, zias, and bit line driver circuits. Analogous circuit elements are present on the word line side as described herein with reference to the other figures and illustrated in FIG. 9B, with word lines passing perpendicular to bit lines between each of the bit line levels 910, 920, 930, 940 above bit line level 940 and below bit line level 910 to form eight layers of memory cells analogous to the cross section shown in FIG. 4 where bleeder diodes are replaced by memory cells. Details of two word line levels and an intervening bit line level are illustrated in FIG. 9C. FIGS. 9A-9C illustrate only one potential arrangement of circuit elements for purposes of illustration, and are not intended to limit the claims to any particular configuration or orientation of circuit elements.

As illustrated in FIG. 9A, the bit line bias generator 304 and low bias voltage source Vubl 305 may be positioned at a bottom level of the three-dimensional memory device 900 (e.g., in a silicon substrate) with respective leads passing vertically to the bit lines BL1-BL16, BL1'-BL16' through zias and to bit line bleeder diodes 300 through zias 318, 320, 318'. While not shown in this figure, the word line bias generator 604 and word line drivers 663 may similarly be positioned on the bottom level of the device passing leads vertically to word lines through zias 606 as shown in FIG. 7, and passing bleeder diode bias voltages to special bit lines 630 through zias 618,

620. The bit line bleeder diode control NMOS transistors 314a, 314' may similarly be positioned in the lower layer of the memory device 900 where they may be coupled on a source (or drain) to the low voltage bias source 305 through lead 312, and coupled at its gate to the bit line decoder 120 through control lead 322. The drain (or source) of the bit line bleeder diode control NMOS transistors 314a, 314' connects to each of the special word lines X3, X7 through zias 318, 320, 318'. The bit line decoder 120 may be fabricated in a low-level, such as in the silicon substrate or on a side of a memory array.

As shown in FIG. 9A, each NMOS transistor 314a, 314' controls a set of bleeder diodes 300, such as a set of 16 bleeder diodes 300. Of course, each NMOS transistor 314 may control more or less than 16 bleeder diodes. For example, NMOS transistor 314a controls 8 bleeder diodes 300 via special word line X7 and 8 bleeder diodes 300 via special word line X3. Special word lines X3 and X7 are connected to each other and to the source or drain of NMOS transistor 314 through zia 318. Of the 8 bleeder diodes connected to line X7, four are located above line X7 and four are located below line X7. The four diodes 300 that are located above line X7 are coupled to bit lines bl1 to bl4 in bit line level 940 (which corresponds to level Y8 in FIGS. 4A and 4B). The four diodes 300 that are located below line X7 are coupled to bit lines bl5 to bl8 in bit line level 930 (which corresponds to level Y6 in FIG. 4). The four diodes 300 that are located above line X3 are coupled to bit lines bl9 to bl12 in bit line level 920 (which corresponds to level Y4 in FIGS. 4A and 4B). The four diodes 300 that are located below line X3 are coupled to bit line level 910 (which corresponds to level Y2 in FIGS. 4A and 4B). Special word lines X3, X7 extend perpendicular to bit lines bl1-bl16 in between the adjacent bit line levels. The NMOS transistor 314b controls another 8 similar bleeder diodes 300 associated with bit lines bl1' to bl8' via special word line X7' and another 8 bleeder diodes 300 associated with bit lines bl9' to bl16' via special word line X3'.

FIG. 9A also illustrates how the bit line bias generator 304 may couple to each of the various bit lines BL1-BL16, BL1'-BL16' through bit line single device driver PMOS transistors 163 positioned in a bottom level or in the substrate. As shown in detail, and as described above, each of the bit line single device driver PMOS transistors 163 may be coupled to a bit line 122, BL1-BL16, BL1'-BL16' at the transistor's source (or drain), coupled to the bit line decoder 120 through control lead 322, and coupled to the bit line bias generator 304 through a bus 804 (e.g., a 16-way bus as illustrated).

As illustrated in FIG. 9B, the special word lines 360, 362 coupled to bleeder diodes 300 may be positioned within alternating (e.g., every other) word line levels 960, 980 (levels X3 and X7 in the illustrated embodiment), while skipping the in between word line levels 950 (X1), 970 (X5), and 990 (X9). This embodiment supports eight layers of memory cells in a single vertical stack.

More details regarding the configuration of memory cells between word line and bit line levels are illustrated in FIG. 9C, which shows a single bit line level 910 sandwiched between two word line levels 950, 960. Each word line level 950, 960 includes a plurality of word lines 112, 114, 116 (numbered 366 in FIGS. 5A and 5B) coupled via the zias 606 within a word line zia area 608 as described above with reference to FIG. 7 to word line drivers circuits positioned below the lowest level in the assembly (i.e., below word line level 950). Similarly, each bit line level 910 includes a plurality of bit lines 122-128 coupled to a bit line decoder 120 and single element driver circuits 163. Memory cells 140 are configured in the volumes between word and bit line levels at the intersections of each word and bit line. In some embodiments one or both of the word line drivers and bit line drivers may be fabricated in-plane with the corresponding word line and bit line levels, as illustrated by dashed word line driver circuit modules 120, 163 and dashed bit line driver circuit modules 604.

While FIG. 9C shows the word and bit line levels separated in an exploded view, the various layers of the memory device are fabricated one on top of each other using known memory device fabrication techniques. Thus, after the plurality of word lines 112, 114, 116 are laid down in the form of rails, the memory elements 140 are formed on top using known silicon processing methods, after which a perpendicular (or other angle) array of bit lines 122-128 are formed as rails that electrically connect to the underlying memory elements 140. This configuration yields a dense three-dimensional array of memory cells 140, only a few of which are illustrated to enhance the clarity of the drawing. As described above, special word lines 360a, 360b within word line level 960 coupled to bleeder diodes 600a, 600b may be coupled to the NMOS transistor 314 positioned at a low-level in the memory assembly and connected through zias 320. Similarly, special bit lines 630 coupled to bleeder diodes 300a, 300b may be coupled to word line bleeder diode control PMOS transistors 614 through zias 618 (see also FIG. 7).

The embodiment illustrated in FIGS. 9A-9C is fully mirrored in that the configuration of levels Y2 and X3 are mirror images of the configurations of levels X3 and Y4. Thus, memory cells 140 extend downward and upward from word line level X3 to bit line level Y2 and bit line Y4 in a mirror orientation. While this configuration may increase the vertical memory cell density, memory circuits may be configured in a non-mirrored configuration. In this alternative embodiment, an insulating layer may be positioned between each pair of word and bit lines levels, in which case the bleeder diodes would extend only between the word and bit lines layers sandwiched between insulating layers. Thus in this embodiment, instead of the bleeder diode extending up and down from every other word line level, bleeder diodes would extend from each word line level to its corresponding bit line level.

Figure 10A:
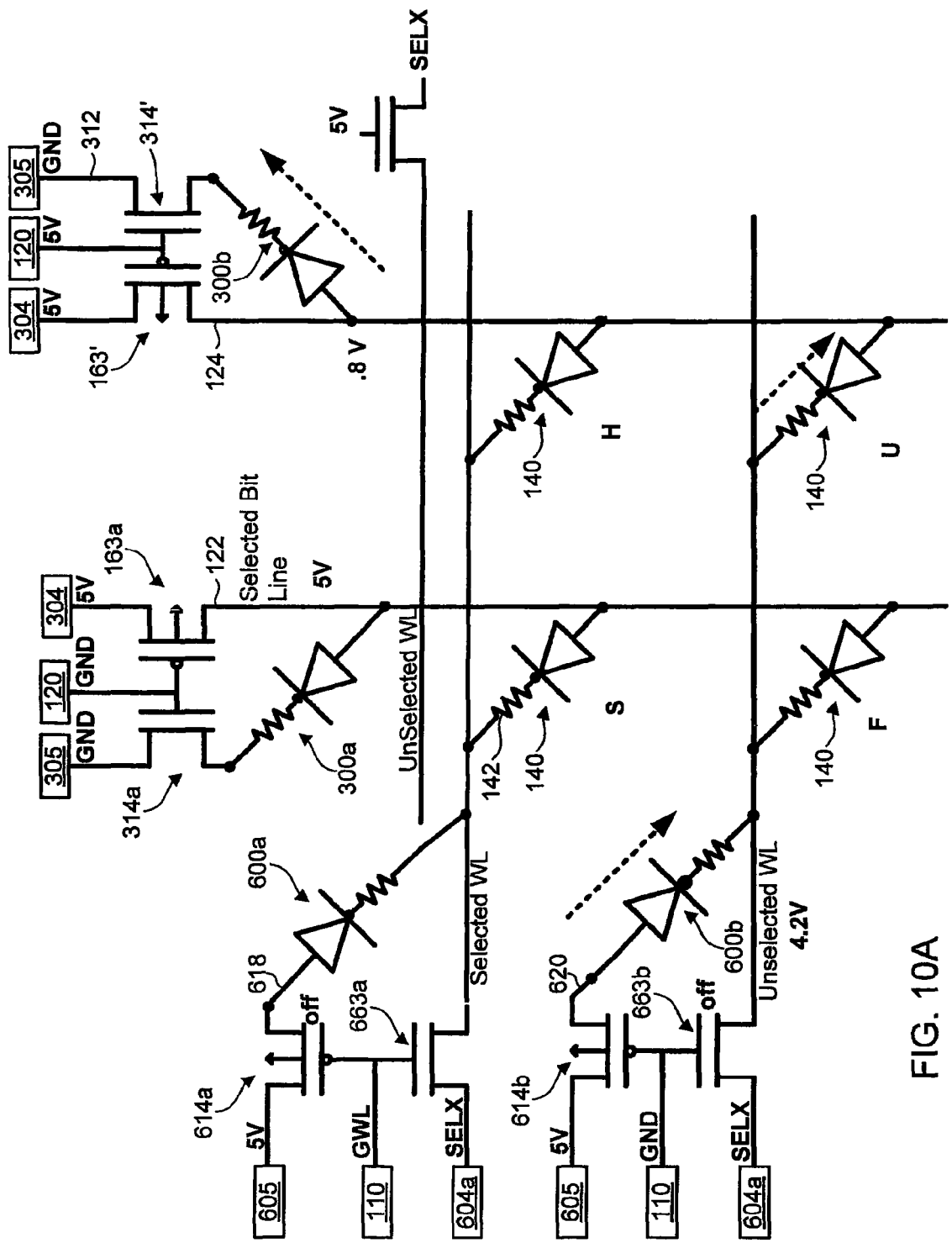
FIGS. 10A and 10B are circuit diagrams of a portion of the memory cell array illustrating voltage drain paths through bleeder diodes during a reset operation according to two embodiments.
Figure 10B:
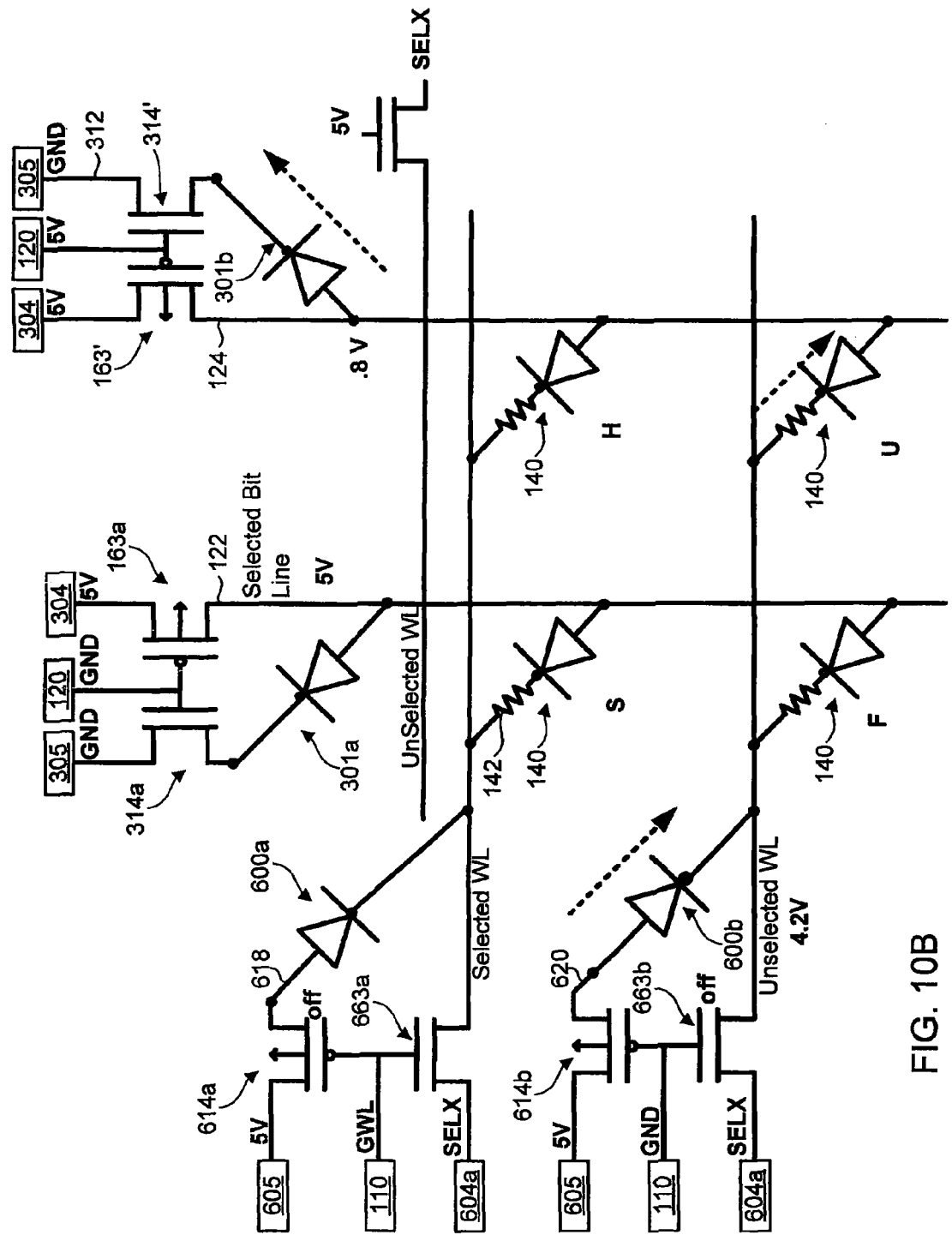

As mentioned above, the bleeder diodes 300, 600 and their respective control transistors (i.e., the bit line bleeder diode control NMOS transistors 314, and word line bleeder diode control PMOS transistors 614) ensure that the proper bias voltage is present on unselected bit lines and word lines, but not on selected bit and word lines. FIGS. 10A and 10B illustrate voltage paths through bleeder diodes 300b, 600b, as well as the applied voltages during a reset operation which writes a "0" to a selected memory cell S (i.e., places the storage element 142 of cell S into the high resistance state). As illustrated in FIGS. 10A and 10B, to select a word line for the reset operation, the drain (or source) of the corresponding word line single device driver NMOS transistor 663a is set to low voltage SELX (e.g., ground) in a pulse signal (e.g., a voltage transition from 4 V to ground and back to 4 V within 50 ns) from the word line bias generator 604a while the gate is set to high voltage GWL (e.g., about 5 V) by a signal from the global word line decoder 110. The voltage applied to the gate of the NMOS transistor 663a is also applied to the gate of the word line bleeder diode control PMOS transistor 614a. As a result, the corresponding word line bleeder diode 600a is isolated from the unselected word line bias Vux (e.g., about 5 V) generated by high bias supply 605. Similarly, to select a bit line for the reset operation, high voltage (e.g., about 5 V) is applied to the drain (or source) of the corresponding selected bit line single device driver PMOS transistor 163a by the bit line bias generator 304 while a low voltage (e.g., ground) is applied to the gate of the selected bit line single device driver PMOS transistor 163a by the bit line decoder 120 and is also applied to the gate of the bit line bleeder diode control NMOS transistor 314a. As a result, the corresponding bit line bleeder diode 300a is isolated from the selected bit line, allowing the single device driver PMOS transistor 163a to drive the selected bit line 122 to a high voltage (e.g., about 5 V). Elsewhere the bit line decoder 120 supplies a high voltage (e.g., about 5V) to the gate of the unselected bit line single device driver PMOS transistor 163' and also to the gate of the bit line bleeder diode control NMOS transistor 314'. The unselected bias generator 305 supplies a low voltage (e.g., Ground) to the source of bit line bleeder diode control NMOS transistor 314'. As a result, the corresponding bit line bleeder diode 300b sinks current (illustrated by the dotted arrow) from the unselected bit line 124, holding the voltage of that bit line to one diode voltage drop above ground (e.g., about 0.8 V). At the unselected word line, the global word line decoder 110 applies a low voltage (e.g., ground) to the gate of the unselected word line single device driver NMOS transistors 663b, which also applies the same voltage to the gate of the corresponding word line bleeder diode control PMOS transistors 614b. At the same time, high voltage Vux is applied to the source (or drain) of the unselected word line bleeder diode control PMOS transistors 614b. The unselected word line bleeder diode 600b supplies current (shown by the dashed arrow) from the drain of the word line bleeder diode control PMOS transistors 614b to the unselected word line. This holds the unselected word line at about one diode voltage drop below the exemplary 5 Volts (e.g., about 4.2 Volts) while leakage current flows through the unselected cell U (illustrated by the dashed arrow).

By way of an example, FIGS. 10A and 10B illustrate embodiments in which the bleeder diodes have a resistance that causes a voltage drop of approximately 0.8V and the high-voltage source 605 provides 5V to the drain (or source) of the word line bleeder diode control PMOS transistors 614b, the resulting bias voltage on the unselected word lines will be approximately 4.2 V. Similarly, if the low-voltage bias source 305 is coupled to ground, unselected bit lines may have a low-voltage bias of approximately 0.8 V. As a result, the reset voltage (e.g., about 5 V) is applied to the selected S memory cell 140, while the half selected memory cells H, F receive a differential voltage of about 0.8 Volts, and unselected cells U receive a differential voltage from unselected word lines to unselected bit lines (e.g., about 3.4 Volts) due to the diode voltage drops of bleeder diodes 300b, 600b.

In the embodiment shown in FIG. 10A, the bleeder diodes 300, 600 are configured as current steering elements coupled to dummy storage elements (as described above with reference to FIGS. 3A and 6A), while in the embodiment shown in FIG. 10B, the bleeder diodes are in the form of current steering elements 301 without dummy storage elements (as described above with reference to FIGS. 3B and 6B).

Figure 11A:
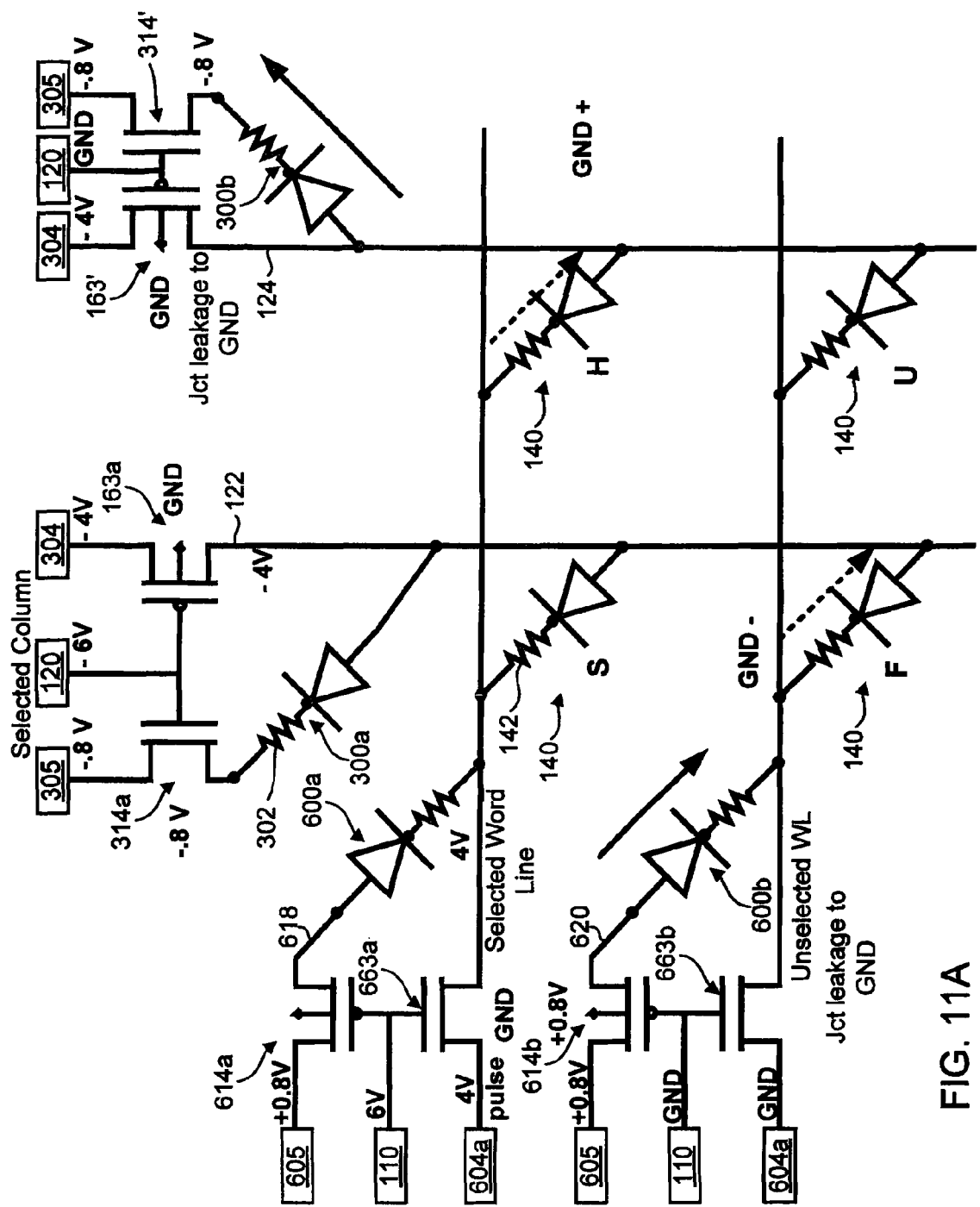
FIGS. 11A and 11B are circuit diagrams of a portion of the memory cell array illustrating voltage drain paths through bleeder diodes during a write (or set) operation according to two embodiments.
Figure 11B:
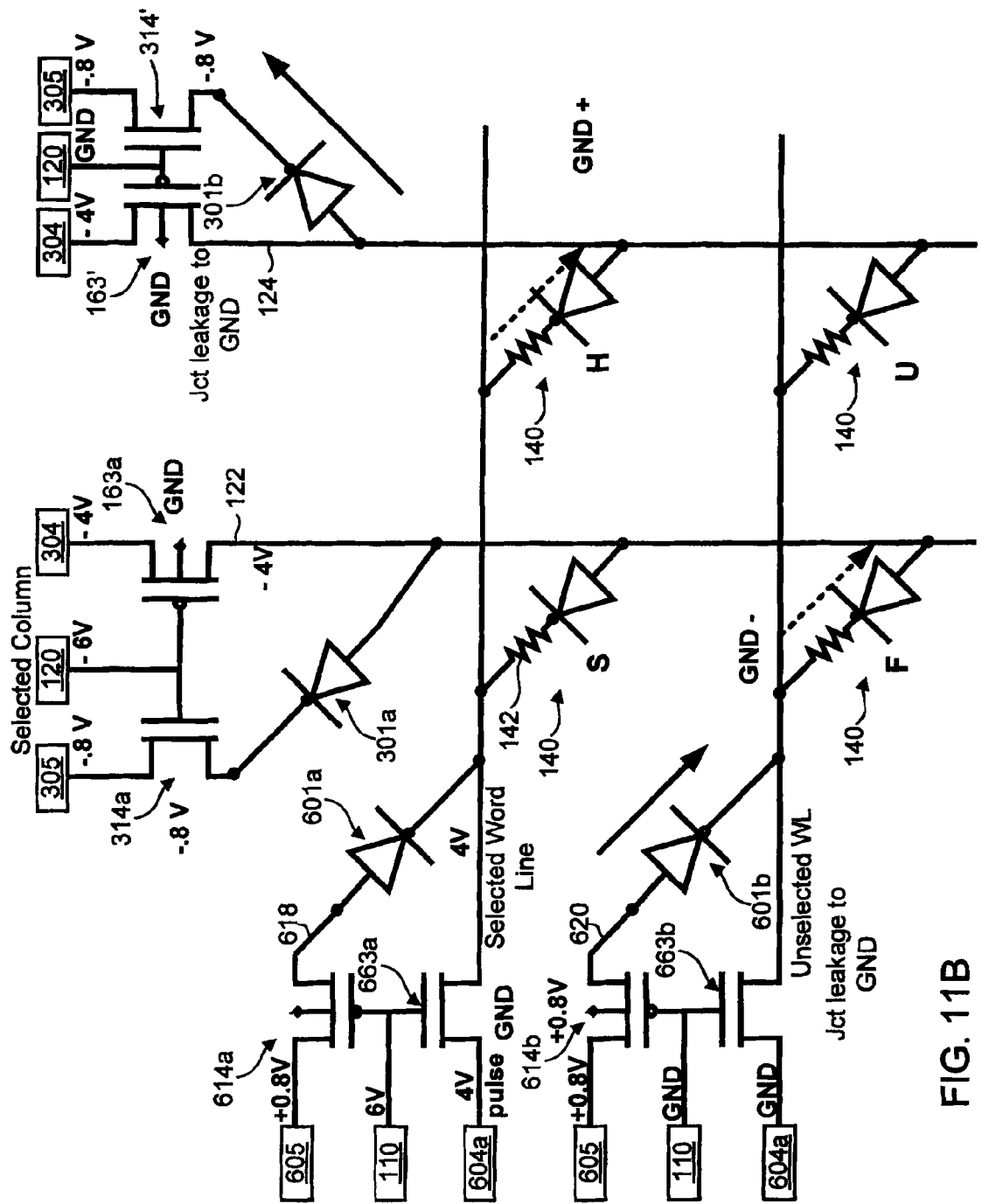

FIGS. 11A and 11B illustrate control voltage settings and voltage paths through bleeder diodes (including steering elements 601a, 601b described above with respect to FIG. 6A) for a set operation for storing a "1" in a memory cell by placing the resistivity switching storage element 142 in a low resistance state. The set operation may be accomplished by applying voltages from the bit line decoder, bit line bias generators, word line decoder and word line bias generators as shown in FIGS. 11A and 11B. A low negative voltage (e.g., −0.8V) is provided from Vub source 305 to the source or drain of transistors 314a, 314', a medium negative voltage (e.g., −4V) is applied to source or drain of transistors 163a, 163', a high negative voltage (e.g., −6V) is applied by the decoder 120 to the gates of transistors 314a, 163a on the selected bit line, and ground is applied by the decoder 120 to the gates of transistors 314', 163' on the non-selected bit line. A low positive voltage (e.g., 0.8V) is provided from Vux source 605 to the source or drain of transistors 614a, 614b, a medium positive voltage (e.g., 4V) is applied to source or drain of selected word line driver transistor 663a, ground is applied to source or drain of non-selected word line driver transistor 663b (which may as discussed below allow junction (Jct) leakage to GND), a high positive voltage (e.g., 6V) is applied by the decoder 120 to the gates of transistors 614a, 663a on the selected word line, and ground is applied by the decoder 120 to the gates of transistors 614b, 663b on the non-selected word line.

As a result, the bit line single device driver PMOS 163a passes the medium negative voltage to the selected bit line 122 and wordline single device driver NMOS 663a passed the medium positive voltage to the selected word line, thereby applying a combined reverse bias to the selected cell S sufficient to set the memory cell S to a low resistance state. The exemplary combined reverse bias (about 8 Volts) is greater than the breakdown voltage of the diode in memory cells 140 and causes a sufficient current (e.g., about 1 micro Amphere) to set the selected memory cell (i.e., transform the resistivity switching storage element 142 to its low resistance state). Bleeder diodes 300a and 600a do not interfere with the selected line biasing because the bleeder diode control devices 314a and 614a are turned off by the same applied voltages that select a particular bit line and word line combination. In a pre-biasing step all bit lines and word lines are biased to ground voltage. The bleeder diode control NMOS transistor 314' which is turned on supplies low negative voltage to bleeder diode 300b, and similarly word line bleeder diode control PMOS 614b supplies low positive voltage to bleeder device 600b. In this state, the unselected bit and word line single device drivers 163', 663b are off and do not interfere with the unselected line bias. The unselected line bleeder diodes 314', 614b hold unselected lines near ground The reverse bias across half selected cells F and H is thus held to the level (e.g., about 4V) of the medium negative voltage and medium positive voltage respectively. The reverse bias is preferably less than the breakdown voltage of diodes in the memory cells 140 so the leakage current (shown by dotted arrows) in half selected cells F and H is less than or equal to the current (shown by solid arrows) flowing in bleeder diodes 600b and 300b, respectively. Multiple bleeder diodes may be included in the memory device to implement the bleeder diodes shown in the schematics, and thereby supply the leakage currents at a low diode voltage drop (e.g., about 0.8V). Additionally the unselected cell U forward bias will limit the voltage drift.

In the embodiment shown in FIG. 11A, the bleeder diodes 300, 600 are configured as current steering elements coupled to dummy storage elements (as described above with reference to FIGS. 3A and 6A), while in the embodiment shown in FIG. 11B, the bleeder diodes are in the form of current steering elements 301 without dummy storage elements (as described above with reference to FIGS. 3B and 6B).

Figure 12:
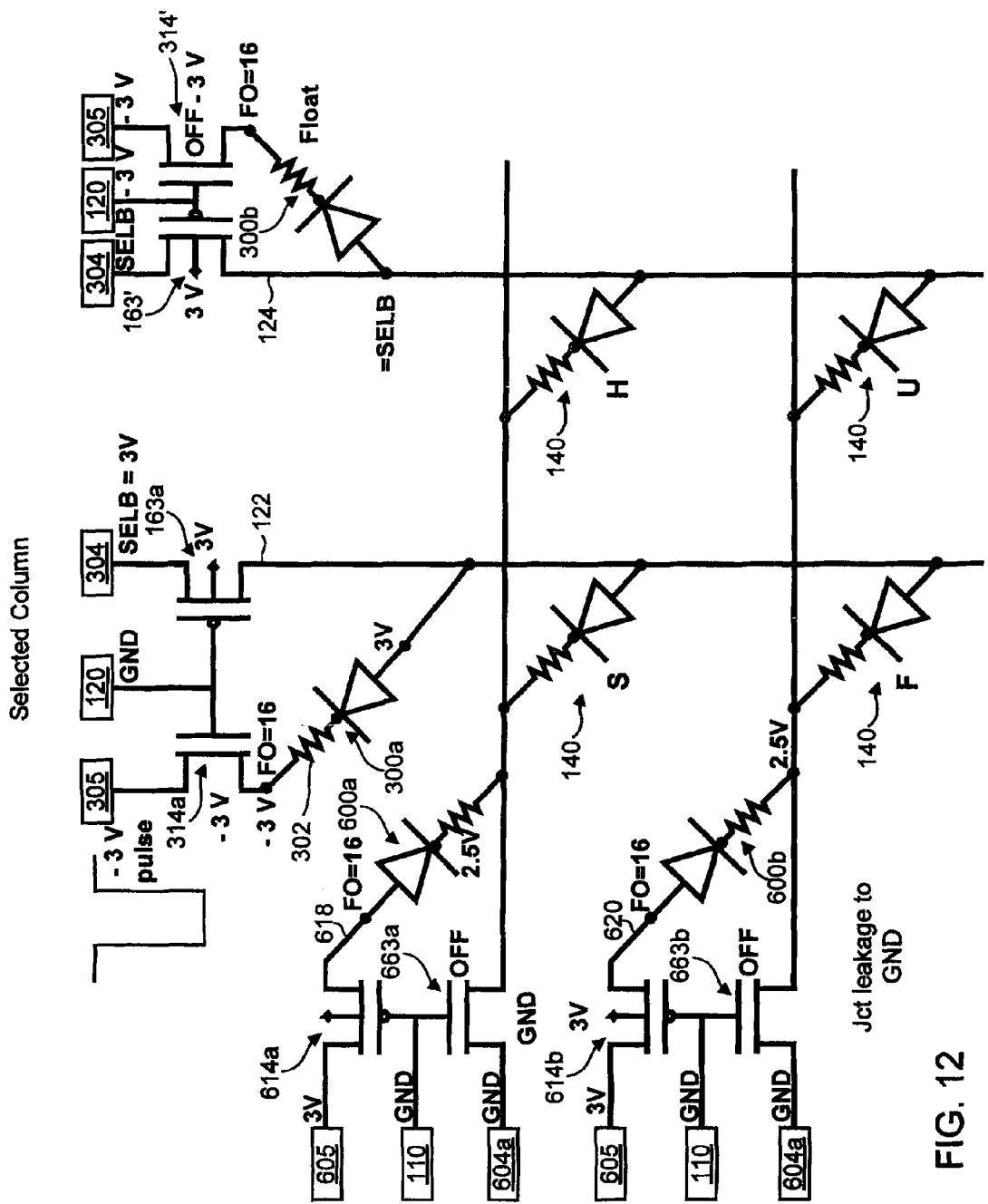
FIG. 12 is a circuit diagram of a portion of the memory cell array illustrating applied voltage is used in pre-forming a dummy storage element of bleeder diodes coupled to bit lines according to an embodiment.
Figure 13:
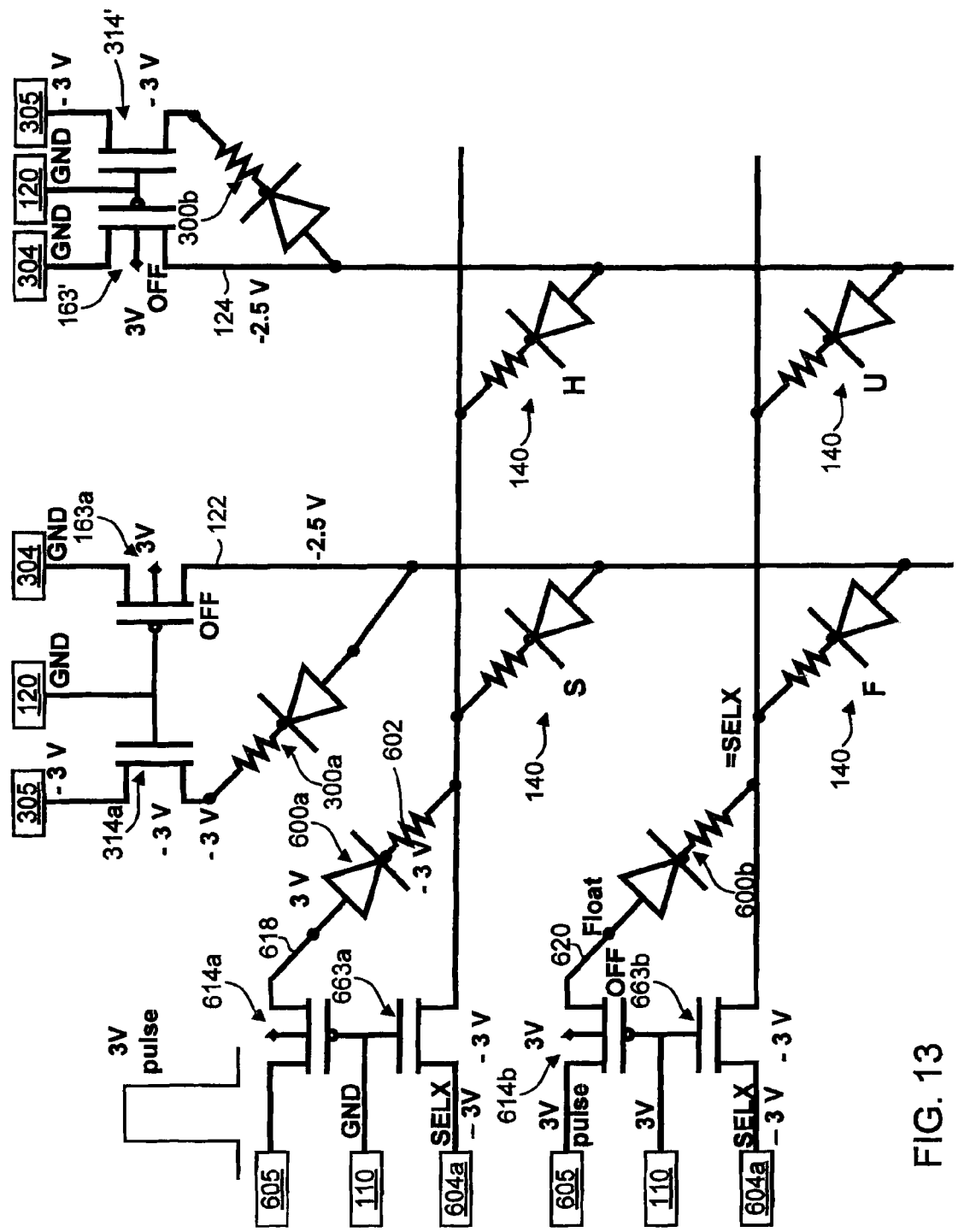
FIG. 13 is a circuit diagram of a portion of the memory cell array illustrating applied voltage is used in pre-forming a dummy storage element of bleeder diodes coupled to word lines according to an embodiment.
Figure 14:
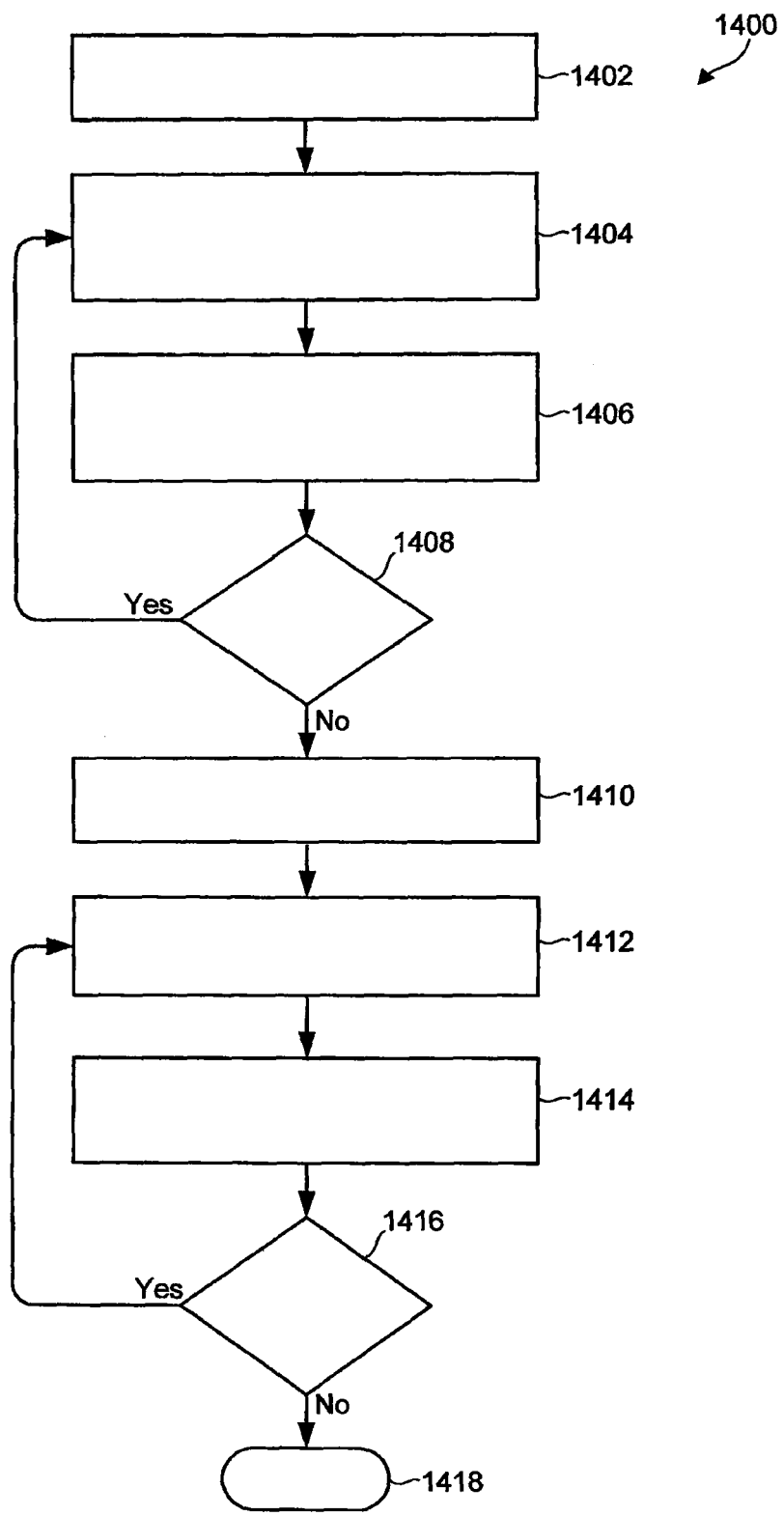
FIG. 14 is a process flow diagram of a method for pre-forming a dummy storage element of the bleeder diodes in a memory cell array according to an embodiment.

As described above with respect to FIGS. 2, 3A and 6A, in a preferred embodiment, the bleeder diodes 300, 600 are composed of a diode 301, 601 formed in series with a dummy storage material 302, 602, such as a pillar comprising the dummy storage material above or below the diode. Preferably, each bleeder diode 301, 601 has the same or similar structure as the diode 141 of the memory cells 140, and the dummy storage element 302, 602 has the same or similar structure and material as the resistivity switching material 142 of each memory cell 140. This enables the bleeder diodes 300, 600 to be fabricated in the same fabrication steps as the memory cells 140. To "activate" the dummy resistivity storage element 302, 602 after fabrication of the memory device, the dummy resistivity storage element can be transformed from its initial high resistivity state to a low resistivity state in an irreversible set operation. An example method 1400 for accomplishing this forward forming set operation is illustrated in FIGS. 12-14. FIG. 12 illustrates a portion of one plane or level of memory cells including two bleeder diodes, and showing voltages applied to transform the dummy resistivity storage material of bit line bleeder diodes. Similarly, FIG. 13 illustrates the same portion of a memory cell array showing voltages applied in transforming the dummy resistivity storage element of word line bleeder diodes. FIG. 14 illustrates an example process 1400 for configuring the bleeder diodes in this forming operation.

Referring to FIGS. 12 and 14 together, the dummy storage elements 302 of the bleeder diodes 300 coupled to bit lines may be irreversibly set to their low resistance state as follows. The word lines may be precharged to about 2.5V in step 1402 by applying the voltages illustrated in FIG. 12 to the various word line leads. All word lines are pulled up by current that may flow through the word line bleeder devices 614a, 614b and the bleeder diodes 600a, 600b. Junction leakage to the body of single device driver NMOS devices 663a, 663b pulls down slightly on the word lines. All bit lines will rise no higher than the positive voltage applied to portions of the bit line driver circuit (e.g., about 3 V) so the memory cells S, H, F, U in the array are not activated. One or more bleeder diodes at selected columns are set to a permanently low resistance state by turning on both the bleeder diode control NMOS 314a and the single device driver PMOS 163a for a sufficient time to set the resistive element 302 in the bleeder diode(s) as explained in more detail in the following steps. In step 1404, a bit line or group of bit lines may be selected by applying a positive bit line selection voltage (e.g., 3V) to source or drain of transistors 163a, 163' from the bit line bias generator 304, and providing from the bit line decoder 120 a ground voltage to the gate of the driver and control devices 163a, 314a as illustrated in FIG. 12. The output (SELB) of the bit line bias generator 304 may be a multiple line bus connected to multiple instantiations of single device driver PMOS transistors 163a, and multiple bleeder diodes instantiated in the array may all be connected to a single bleeder device control NMOS transistor 314a. More than one output (SELB) in a single step 1404 may provide the bit line selection voltage to the driver devices 163a to set more than one bleeder diode 300 in step 1404. Consideration may be given to limit the number of SELB outputs at the bit line selection voltage so the total current flowing through the bleeder diode control device 314a is not excessive, and providing a bias of ground at some SELB outputs to inhibit set current for respective bleeder diodes. The bit line decoder 120 provides a negative voltage of about −3 Volts to the driver device 163' and control device 314' to deselect the bleeder device control NMOS device 163' in unselected columns and turn control device 314' off. The bleeder diodes 300b in unselected columns are thereby floating and do not set. In step 1406, the dummy storage elements 302 of the bleeder diodes 300a may be transformed to their low resistance state by applying a negative voltage pulse of −3V to sources or drains of transistors 314a, as shown in FIG. 12. In determination step 1408, the detection circuitry included in the bit line bias generator 304 may determine whether the dummy storage material on another bit line or group of bit lines remains to be transformed, and if so, the next bit lines or group of bit lines are selected by returning to step 1404. The process of selecting bit lines or groups of bit lines and applying the set voltage pulse of steps 1404 and 1406 continues until all bit lines have been selected and the dummy storage elements of the bleeder diodes have been transformed in the irreversible set operation (i.e., determination step 1408="No").

Referring to FIGS. 13 and 14 together, method 1400 may continue to transform the dummy storage elements 602 of the word line side bleeder diodes 600 to their low resistance state by precharging bit lines to a negative voltage (e.g., about −2.5 V) in step 1410 by applying the voltages illustrated in FIG. 13 to the various bit line leads analogously to step 1402 where word lines becomes bit lines and complementary circuitry is used. In step 1412, a word line or group of word lines may be selected by applying ground potential from the word line decoder 110 to the gates of a word line single device driver transistor 663a and to the corresponding word line bleeder diode control transistor 614a to turn both on, and applying from an output (SELX) of the word line bias generator 614a a negative word line selection voltage (e.g., −3V) to sources or drains of transistors 663a, 663b, as illustrated in FIG. 13. At unselected word lines the word line decoder supplies about 3 volts to gates of transistors 614b so the bleeder diode control transistor 614b is off. In step 1414, the dummy storage elements 602 of bleeder diodes on selected words lines may be transformed to their low resistive state by applying a positive voltage pulse of about 3V to sources or drains of transistors 614a, respectively, as shown in FIG. 13. The plurality of outputs (SELX) from the word line bias generator 604a may be in the form of a multiple line bus connected to multiple driver devices 614a. One or more than one word line bias generator circuit output (SELX) may be biased to −3 volts to set the respective bleeder diode(s), while other outputs (SELX) are biased at ground voltage to inhibit the set current for other bleeder diodes. In determination step 1416, the control device may determine whether the dummy storage element on another word line or group of word lines remains to be transformed, and if so, the next word line or group of word lines is selected by returning to step 1412. The process of selecting word lines or groups of word lines and applying the set voltage pulse of steps 1412 and 1414 continues until all word lines have been selected and the dummy storage elements bleeder diodes transformed in the irreversible set operation (i.e., determination step 1416="No"). Once all word line dummy storage elements have been transformed the forward forming process may end in step 1418.

The memory cells 140 are separately placed in the "1" or "ON" state by reversibly setting the resistivity switching material 141 to a low resistance state at the conclusion of manufacturing in a separate set operation.

In the alternative embodiment described above with reference to FIGS. 3B, 4B, 5B, 6B, 8B, 10B and 11B, the transformed resistivity switching material/dummy storage element 302 and/or 602 of the bleeder diodes 300, 600 may be omitted. During fabrication of the memory device described above, a cut mask may be used to selectively remove or prevent forming of the resistivity switching material/dummy storage element 302 and/or 602 as follows. In one processing embodiment, the dummy storage elements 302, 602 are formed during the same step as the resistivity switching material 142 of the memory cells. Then, a cut mask (e.g., photoresist pattern) is formed over the memory cells 140 to cover material 142 in the memory cells 140, while exposing the dummy storage elements 302, 602. The unmasked dummy storage elements 302, 602 are then etched away, the cut mask is removed, and the process continues. In another processing embodiment, a lift off cut mask (e.g., photoresist pattern) is formed over locations of the bleeder diodes 300, 600 but exposing the locations of the memory cells 140. Then, the resistivity switching storage elements 142 are formed in the memory cell 140 area and over the lift off cut mask in the bleeder diode area. The lift off cut mask is then removed to lift off the resistivity switching material from the bleeder diode areas but not from the memory cell areas.

As mentioned above, the various embodiments enable synchronized control over the unselected bias voltage path and the selected bias voltage path through a memory circuit, by controlling connections of bleeder diodes using the same control signal as is used to control the bit or word line selection device. This enables the path to the unselected bias voltage source from bleeder diodes to be controlled by the same decoder output that controls the path between the selected bias voltage source and bit lines, and the path to the unselected bias voltage source from bleeder diodes to be controlled by the same decoder output that controls the path between the selected bias voltage source and word lines.

While the foregoing description of the various embodiments is sufficient to enable one of skill in the art to practice the invention, additional details regarding bias conditions, bias circuits, and decoder circuits particularly suited for a three-dimensional memory array of write-once anti-fuse passive element memory cells are described in U.S. Pat. No. 6,618,295 entitled "Method And Apparatus For Biasing Selected And Unselected Array Lines When Writing A Memory Array," filed Jun. 29, 2001, and in U.S. patent application Ser. No. 09/897,705 entitled "Three-Dimensional Memory Array Incorporating Serial Chain Diode Stack" filed Jun. 29, 2001, the entire contents of both of which are hereby incorporated by reference.

In the above description, an array line may be shared by two levels of the memory array (i.e., memory planes). As mentioned above, this is referred to as a mirrored configuration. Alternatively, the memory array may be fabricated using two conductors for each plane that are not shared with other planes. A dielectric layer may be used to separate each such memory level in such a non-mirrored configuration.

References herein to word lines and bit lines is not intended to limit the scope of the invention to particular methods of accessing the data stored in such a memory array. In other words, both bit lines and word lines may be alternatively "driven" or "sensed." Also, no preferred memory organization in terms of bits the words is intended or implied, and word line and bit line organizations of the memory array may be easily reversed.

In the foregoing description, the directionality of word lines (X-lines) and bit lines (Y-lines) shown in the figures of the best in the descriptions is merely for ease of description of the 2 groups of crossing lines present in a memory array. No particular orientation is intended or implied. Also, while word lines and bit lines are usually orthogonal as illustrated in the figures, such an orientation of word lines and bit lines is not necessary, and non-orthogonal geometries may be implemented.

The embodiments described herein may refer to selected word lines being driven to a voltage and a selected bit lines being sensed in a read mode, and memory cell anode terminals connected to word lines and cathode terminals connected to bit lines, but other embodiments are specifically contemplated. For example, in a three-dimensional (i.e., multi-level) memory array, and adjacent memory plane may be connected similarly so that the anode terminals are connected to bit lines and the cathode terminals are connected to word lines. Alternatively, adjacent memory planes may be connected so that the polarity of memory cells is reversed in adjacent planes. For example, a word line may be coupled to the anode terminal of memory cells in one associated memory plane, and may be coupled to the cathode terminal of memory cells in an adjacent memory plane.

The process flow diagram shown in FIG. 14 and the foregoing method description are provided merely as an illustrative example and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A memory array, comprising:
   an array of memory cells positioned between a plurality of word lines and a plurality of bit lines; and
   a circuit comprising:
      a bleeder diode having a first terminal coupled to a first word line of the plurality of word lines;
      a word line bleeder diode controller having a control input lead, a source lead, and an output lead, wherein the output lead is coupled to a second terminal of the bleeder diode, the source lead is coupled to a bias voltage source, and the control input lead is coupled to a word line decoder control lead; and
      at least one first transistor of a first conductivity type having a gate coupled to the word line decoder control lead, at least one of a source or a drain coupled to a word line bias generator circuit, and the other one of the source or the drain coupled to the first word line.

2. The array of claim 1, wherein a path to an unselected bias voltage source from a word line bleeder diode is controlled by a same word line decoder output that controls a path between a selected bias voltage source and the first word line.

3. The array of claim 1, wherein the at least one first transistor comprises a single device driver configured to select the first word line in response to signals from the word line decoder and the word line bias generator circuit.

4. The array of claim 1, wherein the word line bleeder diode controller comprises a second transistor of a second conductivity type different from the first conductivity type, the second transistor having a gate, a drain, and a source, wherein one of the drain or the source of the second transistor is the word line bleeder diode controller output lead coupled to the second terminal of the bleeder diode, the other one of the drain or the source of the second transistor is the word line bleeder diode controller source lead coupled to the bias voltage source, and the gate of the second transistor is the word line bleeder diode controller control input lead coupled to the word line decoder control lead.

5. The array of claim 4, wherein the second transistor is a PMOS transistor, and the at least one first transistor is an NMOS transistor.

6. The array of claim 5, wherein the at least one first NMOS transistor comprises a plurality of first NMOS transistors, each first NMOS transistor having a gate coupled to the word line decoder control lead, at least one of a source or a drain coupled to a different word line bias generator circuit output, and the other one of the source or the drain coupled to a different one of a plurality of word lines.

7. The array of claim 1, wherein:
the bleeder diode comprises a plurality of bleeder diodes each having a first terminal coupled to one of a plurality of word lines; and
the word line bleeder diode controller comprises a plurality of word line bleeder diode controllers, wherein each of the plurality of word line bleeder diode controllers has a control input lead, a source lead, and an output lead, the output lead of each of the plurality of word line bleeder diode controllers is coupled to a second terminal of each of the plurality of bleeder diodes, the source lead of each of plurality of word line bleeder diode controllers is coupled to a bias voltage source, and the control input lead of each of the plurality of word line bleeder diode controllers is coupled to the word line decoder control lead.

8. The array of claim 1, wherein:
the array comprises a monolithic three dimensional array of memory cell levels;
the word line bias generator circuit and the word line bleeder diode controller are located below the array of memory cell levels;
the word line decoder is located in at least one level of the array of memory cell levels;
the bleeder diode is located in least one level or between two levels of the array of memory cell levels; and
the word line bleeder diode controller is coupled to the bleeder diode by a zia and a special bit line.

9. The array of claim 1, wherein the bleeder diode comprises a diode steering element.

10. The array of claim 9, wherein the bleeder diode comprises a dummy storage element connected in series with the diode steering element.

* * * * *